(12) United States Patent
Yezerets et al.

(10) Patent No.: US 11,703,548 B2
(45) Date of Patent: Jul. 18, 2023

(54) METHODS AND SYSTEMS FOR ACCELERATED DETERMINING OF STATE OF HEALTH USING INCREMENTAL CAPACITY ANALYSIS

(71) Applicant: Cummins Inc., Columbus, IN (US)

(72) Inventors: Aleksey Yezerets, Columbus, IN (US); Guodong Fan, Columbus, IN (US)

(73) Assignee: CUMMINS INC., Columbus, IN (US)

( * ) Notice: Subject to any disclaimer, the term of this patent is extended or adjusted under 35 U.S.C. 154(b) by 92 days.

(21) Appl. No.: 17/205,330

(22) Filed: Mar. 18, 2021

(65) Prior Publication Data

US 2021/0311129 A1 Oct. 7, 2021

Related U.S. Application Data

(60) Provisional application No. 63/004,742, filed on Apr. 3, 2020.

(51) Int. Cl.
*G01R 31/392* (2019.01)
*G01R 31/385* (2019.01)

(52) U.S. Cl.
CPC ......... *G01R 31/392* (2019.01); *G01R 31/385* (2019.01)

(58) Field of Classification Search
CPC .. G01R 31/392; G01R 31/382; G01R 31/374; G01R 31/3835; G01R 31/378; G01R 31/389; G01R 31/367; G01R 31/388; Y02T 10/70; H01M 10/4285; H01M 10/48; Y02E 60/10
USPC ........... 324/400, 430–433, 500, 600, 764.01, 324/103 R, 771, 761.01, 501, 639, 642, 324/702, 76.11, 76.66, 96
See application file for complete search history.

(56) References Cited

U.S. PATENT DOCUMENTS

| | | | |
|---|---|---|---|
| 8,548,762 B2 | 10/2013 | Prada | |
| 9,121,910 B2 | 9/2015 | Maluf | |
| 9,197,089 B2 | 11/2015 | Choe et al. | |
| 9,583,796 B2 | 2/2017 | Saha et al. | |
| 2015/0377976 A1 | 12/2015 | Maluf et al. | |
| 2016/0370433 A1* | 12/2016 | Chazal | G01R 31/392 |
| 2019/0123574 A1 | 4/2019 | Jung et al. | |

(Continued)

FOREIGN PATENT DOCUMENTS

WO 2019162750 A1 8/2019

*Primary Examiner* — Lee E Rodak
*Assistant Examiner* — Trung Q Nguyen
(74) *Attorney, Agent, or Firm* — Faegre Drinker Biddle & Reath LLP

(57) ABSTRACT

Systems and methods for determining state of health (SOH) of a battery. For example, a method includes conditioning the battery by determining an initial state of charge of the battery; charging the battery from the initial state of charge to a first target state of charge via a predetermined multi-stage charging sequence; and determining SOH of the battery by charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an incremental capacity analysis (ICA) peak from the IC data; and determining the SOH of the battery based upon the ICA peak.

18 Claims, 20 Drawing Sheets

(56) References Cited

U.S. PATENT DOCUMENTS

2019/0202299 A1   7/2019   Oh et al.
2021/0325470 A1* 10/2021   Patil .................... G01N 27/228

* cited by examiner

US 11,703,548 B2

METHODS AND SYSTEMS FOR ACCELERATED DETERMINING OF STATE OF HEALTH USING INCREMENTAL CAPACITY ANALYSIS

This application claims the benefit of U.S. Application No. 63/004,742 filed on Apr. 3, 2020, which is incorporated by reference in its entirety.

FIELD OF THE DISCLOSURE

Certain embodiments of the present disclosure are directed to battery analysis. More particularly, some embodiments of the disclosure provide systems and methods for accelerated determining of battery state of health using Incremental Capacity Analysis.

BACKGROUND OF THE DISCLOSURE

In various use cases, such as in mobile storage (e.g., electric vehicles), stationary storage (e.g., grid storage) and portable storage (e.g., personal electronics) applications, a state of health (SOH) of an energy storage device is an indication of the health condition of the energy storage device. For many battery management systems (BMS), SOH is key information. In some scenarios, SOH corresponds to the decrease of total capacity and/or rise of internal resistance, compared to a fresh cell. As an example, a fresh cell (e.g., off-the-manufacturing-line or off-the-shelf) often has an initial SOH of 100% or near 100% (e.g., above 90%, 95%, or 99%), whereas an aged cell (e.g., having been discharged and charged at least by one cycle) has an aged SOH less than the initial SOH. Monitoring SOH is applicable for a variety of energy storage devices, including but not limited to a lithium-ion battery, a sodium-ion battery, a supercapacitor, a fuel cell, a flow battery, a metal-air battery, a molten salt battery, a nickel metal hydride battery, a sodium-sulfur battery, and a lead-acid battery. In some use cases, adapting a system and/or a method (e.g., a SOH estimation algorithm) for predicting SOH quickly, accurately, robustly, and/or in real-time, is very desirable for battery health diagnostics and prognostics.

BRIEF SUMMARY OF THE DISCLOSURE

Certain embodiments of the present disclosure are directed to battery analysis. More particularly, some embodiments of the disclosure provide systems and methods for determining battery state of health using Incremental Capacity Analysis and Support Vector Regression. Merely by way of example, some embodiments of the disclosure have been applied to diagnosing a battery. But it would be recognized that the disclosure has a much broader range of applicability, such as for other types of energy storage devices.

A computer-implemented method for determining state of health of a battery, the method comprising: conditioning the battery by at least: determining an initial state of charge of the battery; charging the battery from the initial state of charge to a first target state of charge via a predetermined multi-stage charging sequence; and determining state of health of the battery by at least: charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an ICA peak from the IC data; and determining the state of health of the battery based at least in part upon the ICA peak.

A system for determining state of health of a battery, the system comprising: a conditioning module configured to condition the battery by at least: determining an initial state of charge of the battery; charging the battery from the initial state of charge to a first target state of charge via a predetermined multi-stage charging sequence; and a state of health determining module configured to determine state of health of the battery by at least: charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an ICA peak from the IC data; and determining the state of health of the battery based at least in part upon the ICA peak.

A non-transitory computer-readable medium with instructions stored thereon, that when executed by a processor, cause the processor to perform: conditioning the battery by at least: determining an initial state of charge of the battery; charging the battery from the initial state of charge to a first target state of charge via a predetermined multi-stage charging sequence; and determining state of health of the battery by at least: charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an ICA peak from the IC data; and determining the state of health of the battery based at least in part upon the ICA peak.

Depending upon the embodiment, one or more benefits may be achieved. These benefits and various additional objects, features and advantages of the present disclosure can be fully appreciated with reference to the detailed description and accompanying drawings.

DETAILED DESCRIPTION OF THE DISCLOSURE

Figure 1:
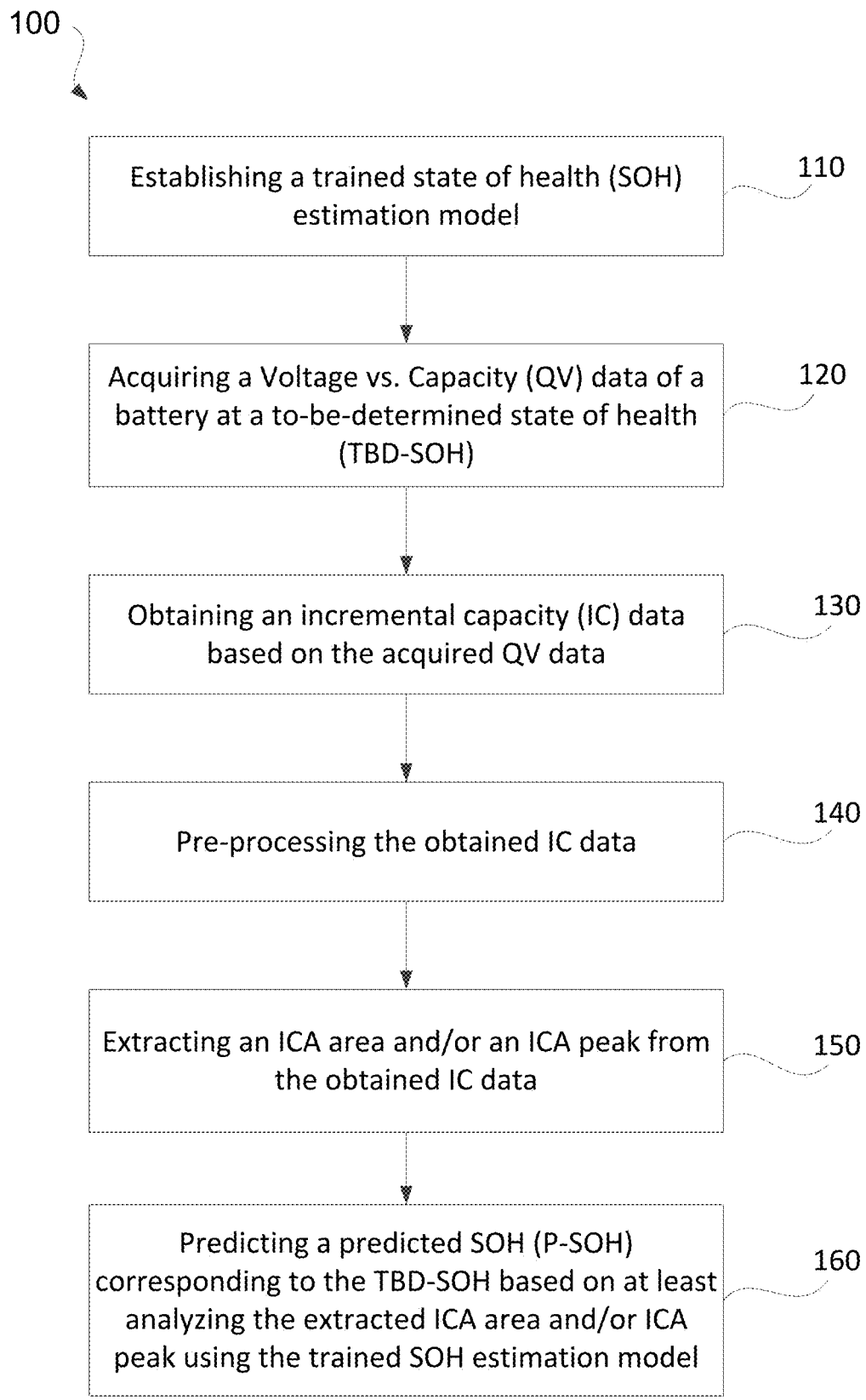
FIG. 1 is a simplified diagram showing a method for predicting a predicted state of health of a battery, according to some embodiments of the present disclosure.

Certain embodiments of the present disclosure are directed to battery analysis. More particularly, some embodiments of the disclosure provide systems and methods for determining battery state of health using Incremental Capacity Analysis and Support Vector Regression. Merely by way of example, some embodiments of the disclosure have been applied to diagnosing a battery (e.g., a rechargeable battery). But it would be recognized that the disclosure has a much broader range of applicability, such as for other types of energy storage devices.

In various examples, Incremental Capacity Analysis (ICA) is used to investigate the change of the battery state (e.g., a battery's SOH) by tracking one or more electrochemical properties of the cell. For example, the one or more electrochemical properties includes capacity and/or internal resistance. In various embodiments, ICA provides insights on battery degradation in a quantifiable manner. In certain examples, ICA includes acquiring (e.g., measuring) a voltage vs. capacity (QV) data of a battery, for example, during a charging cycle, then calculating the differentiation of the battery capacity (Q) over the battery voltage (V) at a predetermined condition (e.g., voltage range). In some examples, ICA includes examining the evolution of the differentiation result, which may be presented as an IC curve (e.g., a dQ/dV vs. V curve), as battery ages (e.g., increase in charged cycles) and to monitor a correlation between the battery's SOH and an ICA area (A) and/or an ICA peak (P). In various examples, the ICA area represents the area value under the IC curve (e.g., integration of the IC curve), whereas the ICA peak represents the capacity value of a peak (e.g., the highest peak) of the IC curve.

In some examples, the ICA area and/or the ICA peak are determined (e.g., extracted) from the IC curve under a predetermined condition, such as a predetermined voltage range. In other words, the ICA area and/or the ICA peak are determinable from a partial ICA curve and not requiring the full ICA curve, in accordance with various embodiments. In certain examples, the predetermined voltage range is smaller than the charging voltage range, for example, the predetermined voltage range is less than 90%, 80%, 70%, 60%, 50%, 40%, 30%, 20%, or 10% of the charging voltage range. As an example, for a charging voltage range of 2V to 4V, a predetermined voltage range can be from 2.5V to 3.5V. In some embodiments, an ICA curve obtained for a charging cycle that is partial (e.g., not charged to 100% state of charge) instead of full (e.g., charged to 100% state of charge) is sufficient for extracting an ICA area and/or an ICA peak, thus enabling estimation of SOH of a battery without the need to fully charge the battery.

In various examples, Support Vector Regression (SVR) is used in the establishing of a trained SOH estimation model. In certain examples, SVR is used as a machine learning method for analyzing data used for linear and/or nonlinear regression analysis of the ICA characteristics (e.g., the ICA area and/or the ICA peak). In some examples, a SVR model is developed to identify the nonlinear correlations between the battery SOH and the ICA characteristics. In certain embodiments, the use of ICA and SVR reduces SOH estimation error, such as error induced by battery cell variations and measurement noise, thus improving the robustness of the system and/or method for predicting SOH of a battery. In some embodiments, the use of ICA and SVR increases the speed of battery SOH estimation, for example, by eliminating the need to charge or discharge the battery substantially to obtain sufficient data for battery SOH estimation.

FIG. 1 is a simplified diagram showing a method 100 for predicting a predicted state of health of a battery (e.g., a rechargeable battery), according to some embodiments of the present disclosure. This diagram is merely an example, which should not unduly limit the scope of the claims. One of ordinary skill in the art would recognize many variations, alternatives, and modifications. In some examples, the method 100 includes a process 110 of establishing a trained state of health (SOH) estimation model, a process 120 of acquiring a Voltage vs. Capacity (QV) data of a battery at a to-be-determined state of health (TBD-SOH), a process 130 of obtaining an incremental capacity (IC) data based on the acquired QV data, a process 140 of pre-processing the obtained IC data, a process 150 of extracting an ICA area and/or an ICA peak from the obtained IC data, and a process 160 of predicting a predicted SOH (P-SOH) corresponding to the TBD-SOH based on at least analyzing the extracted ICA area and/or ICA peak using the trained SOH estimation model. Although the above has been shown using a selected group of processes for the method, there can be many alternatives, modifications, and variations. For example, one or more processes may be expanded and/or combined. One or more processes may be inserted to those noted above. One or more processes may be removed. Depending upon the embodiment, the sequence of the processes may be interchanged with others replaced.

Figure 2:
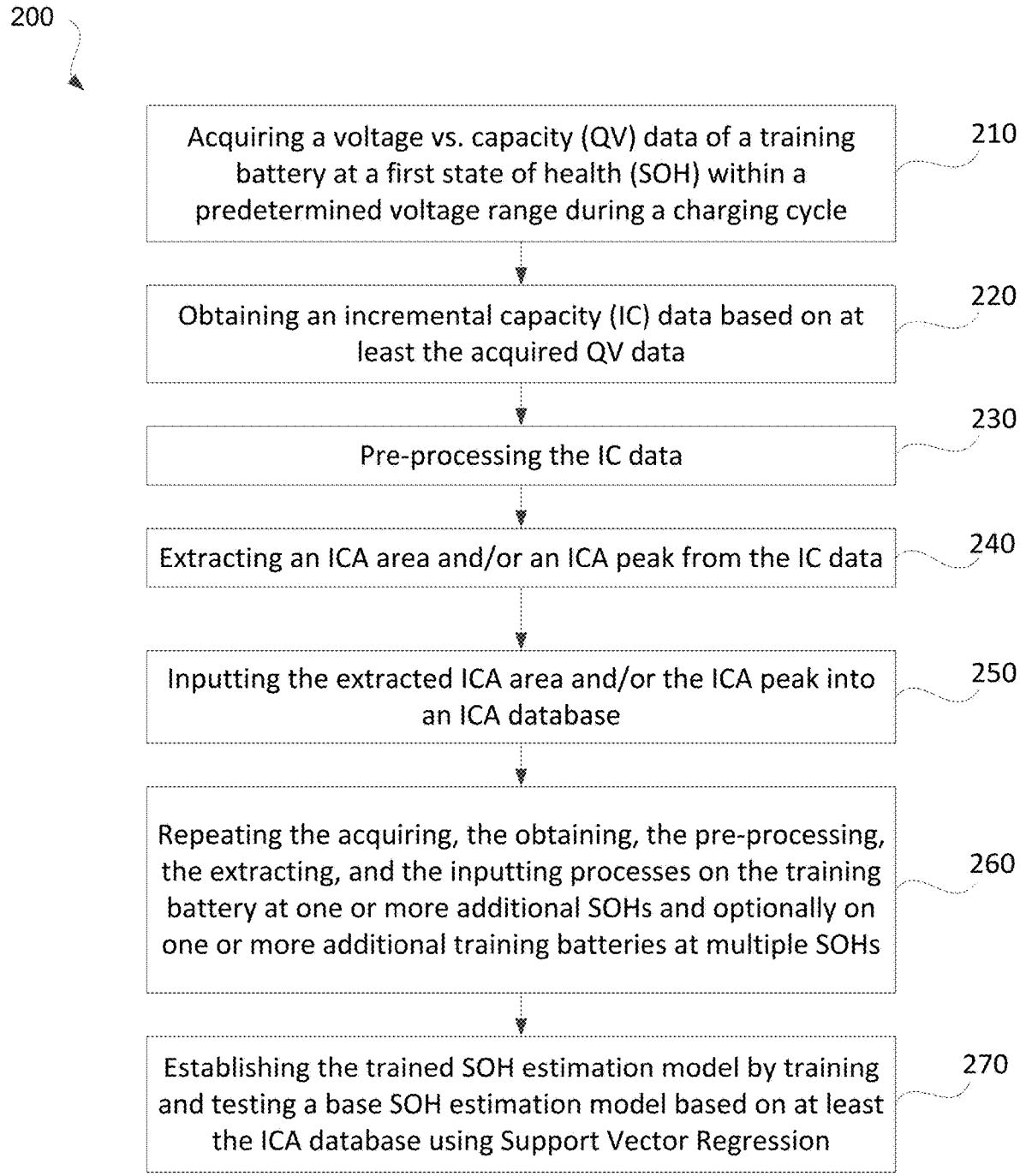
FIG. 2 is a simplified diagram showing a method for establishing a trained state of health (SOH) estimation model, according to some embodiments of the present disclosure.

In various embodiments, the process 110 of establishing a trained SOH estimation model is depicted in FIG. 2. FIG. 2 is a simplified diagram showing a method 200 for establishing a trained SOH estimation model, according to some embodiments of the present disclosure. This diagram is merely an example, which should not unduly limit the scope of the claims. One of ordinary skill in the art would recognize many variations, alternatives, and modifications. In some examples, the method 200 includes a process 210 of acquiring a QV data of a training battery at a first SOH within a predetermined voltage range during a charging cycle, a process 220 of obtaining an IC data based on at least the acquired QV data, a process 230 of pre-processing the IC data, a process 240 of extracting an ICA area and/or an ICA peak from the IC data, a process 250 of inputting the extracted ICA area and the ICA peak into an ICA database, a process 260 of repeating the acquiring, the obtaining, the pre-processing, the extracting, and the inputting processes on the training battery at one or more additional SOHs and optionally on one or more additional training batteries at multiple SOHs, and a process 270 of establishing the trained SOH estimation model by training and testing a base SOH estimation model based on at least the ICA database using Support Vector Regression. Although the above has been shown using a selected group of processes for the method, there can be many alternatives, modifications, and variations. For example, one or more processes may be expanded and/or combined. One or more processes may be inserted to those noted above. One or more processes may be removed. Depending upon the embodiment, the sequence of the processes may be interchanged with others replaced. In certain alternative embodiments, the process 110 of establishing a trained SOH estimation model includes receiving the trained SOH estimation model from a model source (e.g., a server, an external storage drive).

Figure 3:
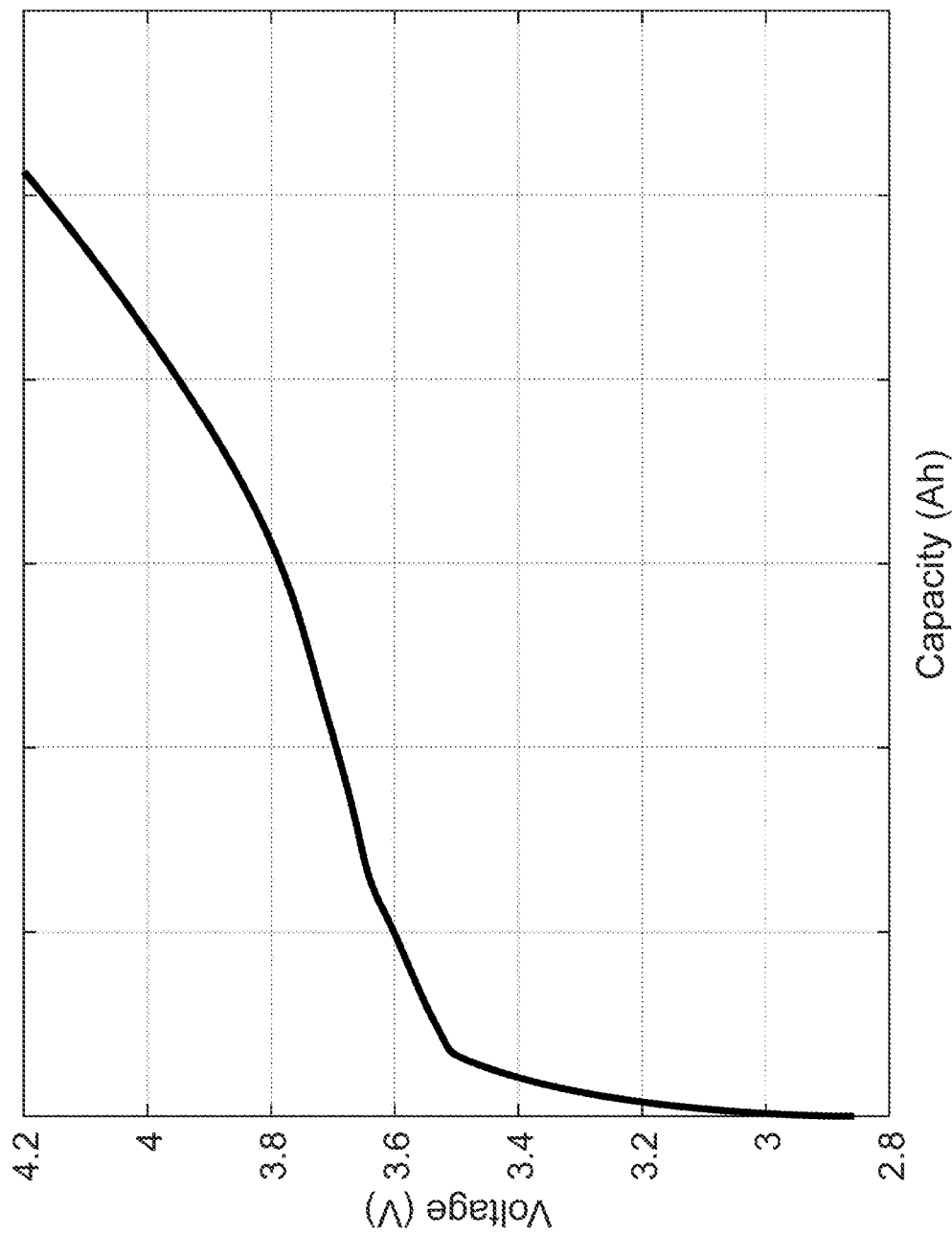
FIG. 3 is a representative diagram showing a voltage vs. capacity (QV) data acquired during a charging cycle of a battery.

In various embodiments, the process 210 of acquiring a QV data of a training battery (e.g., for purpose of establishing the trained SOH estimation model) at a first SOH within a predetermined voltage range during a charging cycle includes measuring the QV data including battery voltage data and corresponding battery capacity data of the training battery within a target voltage range during a charging cycle. As an example, FIG. 3 shows a QV curve (e.g., V data plotted on a V vs. Q graph) of a QV data acquired during a charging cycle of a battery within a charging voltage range of about 2.9V to 4.2V. In certain examples, the charging cycle is a constant current charging cycle. In certain alternative embodiments, the process 210 includes acquiring the QV data of the training battery during a discharging cycle (e.g., a constant current discharging cycle). In some examples, the first SOH is a known SOH or a reference SOH.

Figure 4:
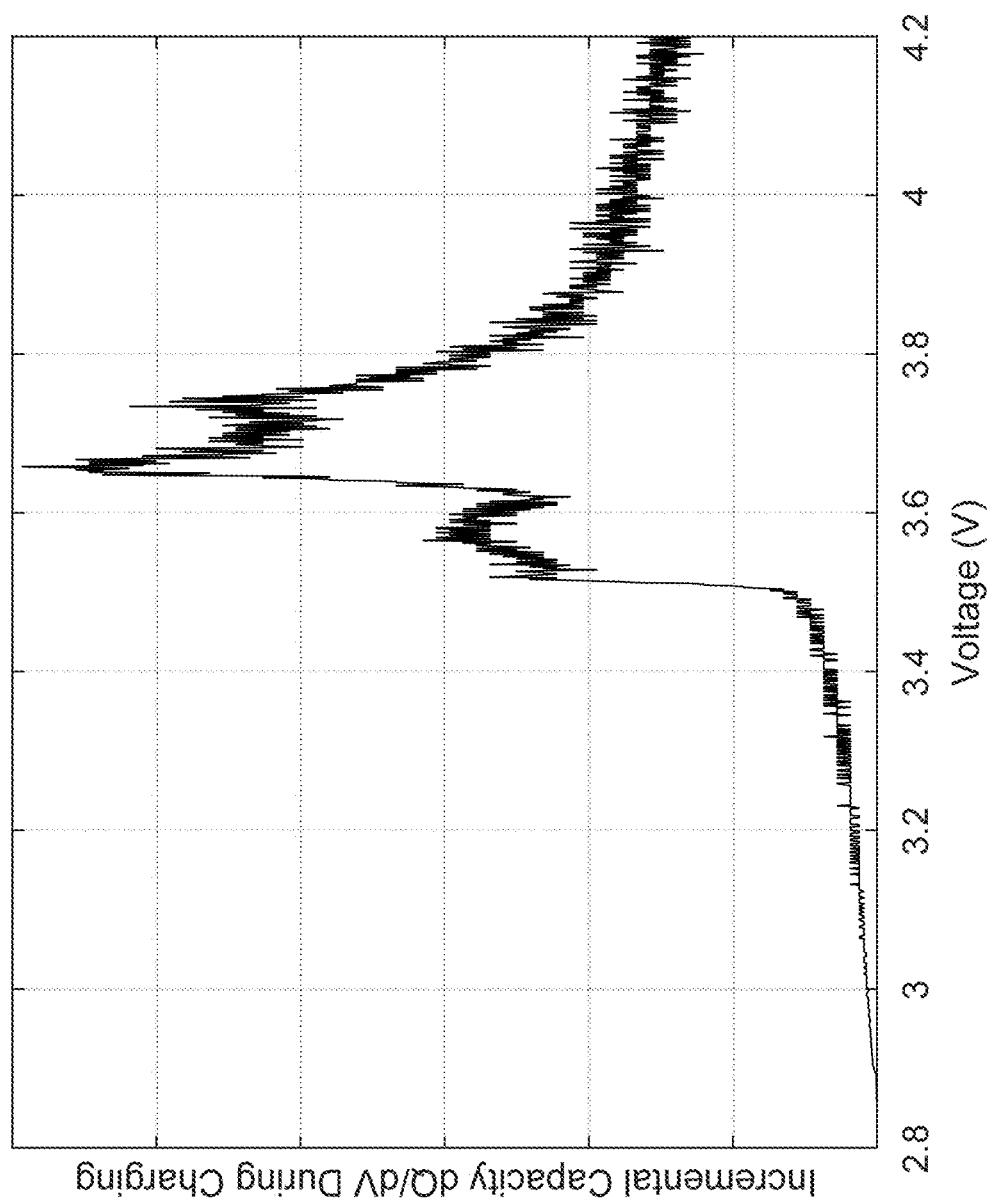
FIG. 4 is a representative diagram showing an incremental capacity (IC) data obtained based on at least the QV data of FIG. 3.

In various embodiments, the process 220 of obtaining an IC data based on at least the acquired QV data includes differentiating the acquired battery capacity over the battery voltage, such as taking a first derivative of a QV curve of a QV data:

$$\frac{dQ}{dV} = \frac{\Delta Q}{\Delta V} = \frac{Q_k - Q_{k-1}}{V_k - V_{k-1}}$$

where k is selected from a range of 1 to K, where K is the total number of QV data-pairs. As an example, FIG. 4 shows an IC curve (e.g., IV data plotted on a dQ/dV vs. V graph) of an IC data acquired based on at least the QV data of FIG. 3.

In various embodiments, the process 230 of pre-processing the IC data includes smoothening the IC data. In some examples, smoothening the IC data is performed using a gaussian smoothening algorithm. In certain examples, smoothening the IC data includes reducing noise, removing outliers, and/or altering the curve based on a pre-processing model (e.g., an artificial intelligence model). As an example, FIG. 5 shows a pre-processed IC curve of the IC curve of FIG. 4.

In some embodiments, obtaining an IC curve (e.g., pre-processed IC curve) of a battery includes obtaining one or more peaks each corresponding to one of one or more peak values of the corresponding IC data. A peak value of an IC data may be referred to as an ICA peak. As an example, the smoothened IC curve of FIG. 5 shows three peaks each corresponding to an electrochemical process. FIG. 6 is a representative diagram showing an insertion map of a NMC-Graphite Li-ion battery. NMC stands for Lithium Nickel Manganese Cobalt Oxide, which is a cathode material in this electrochemical couple. As shown, for a NMC-Graphite Li-ion battery, three electrochemical processes can be mapped onto an IC curve (e.g., see FIG. 5) of the NMC-Graphite Li-ion battery. Specifically, the highest peak in FIG. 5 corresponds to the 2*2 electrochemical process in FIG. 6, the second highest peak in FIG. 5 corresponds to the 1*1 electrochemical process in FIG. 6, and the third highest peak in FIG. 5 corresponds to the 2*5 electrochemical process in FIG. 6. In certain embodiments, as a battery ages, one or more peaks of an IC curve reduce in magnitude and can disappear, indicating that its corresponding electrochemical process is substantially inhibited, leading to loss in recoupable battery capacity. In some examples, monitoring the loss or reduction of an electrochemical process provides a quantifiable insight on battery degradation. In certain examples, a loss or reduction of an electrochemical process indicates a loss of Li-ion inventory (e.g., transportable between the cathode and anode), such as in a Li-ion battery.

Figure 5:
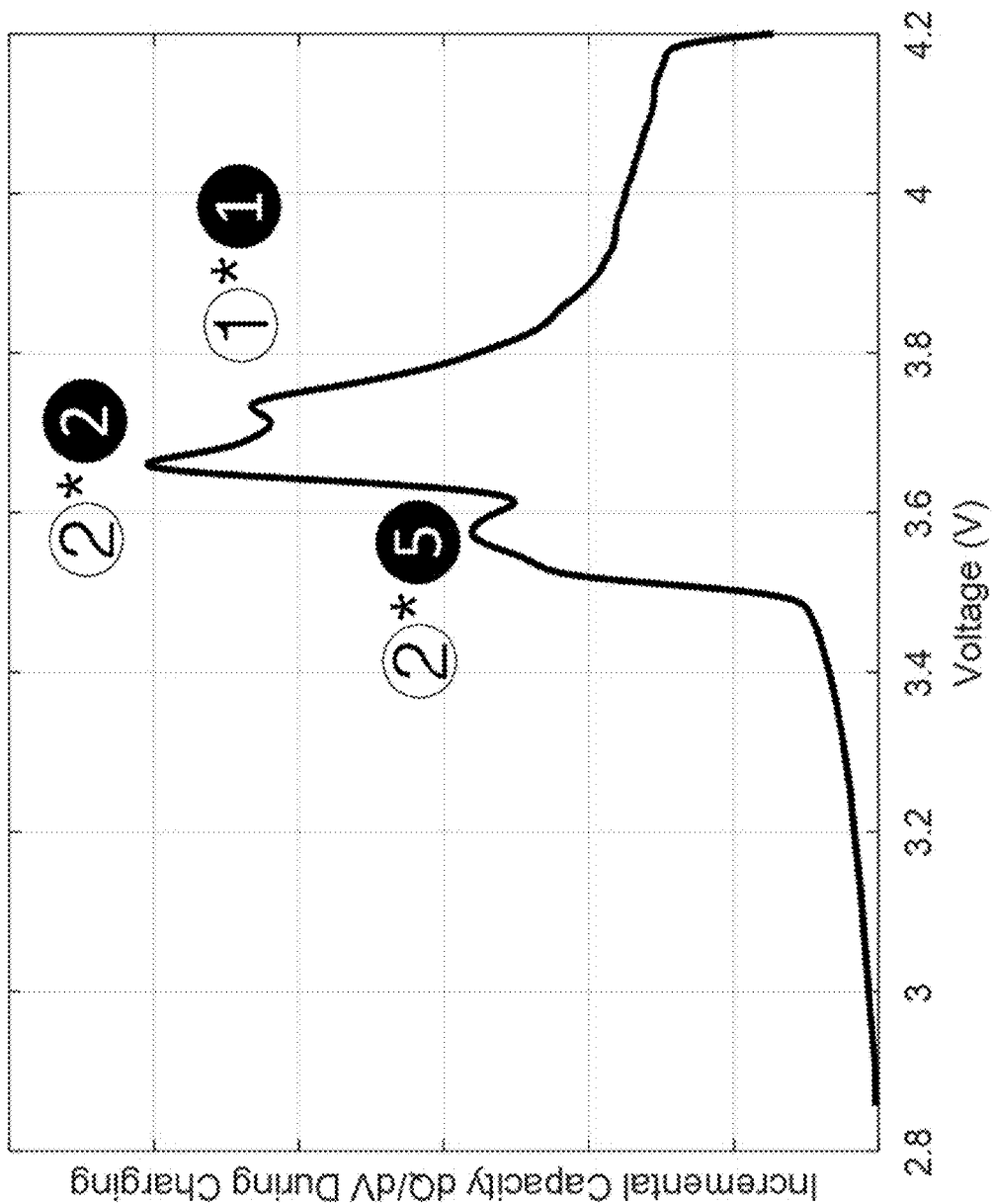
FIG. 5 is a representative diagram showing a smoothened IC data obtained based on at least smoothening the IC data of FIG. 4.
Figure 6:
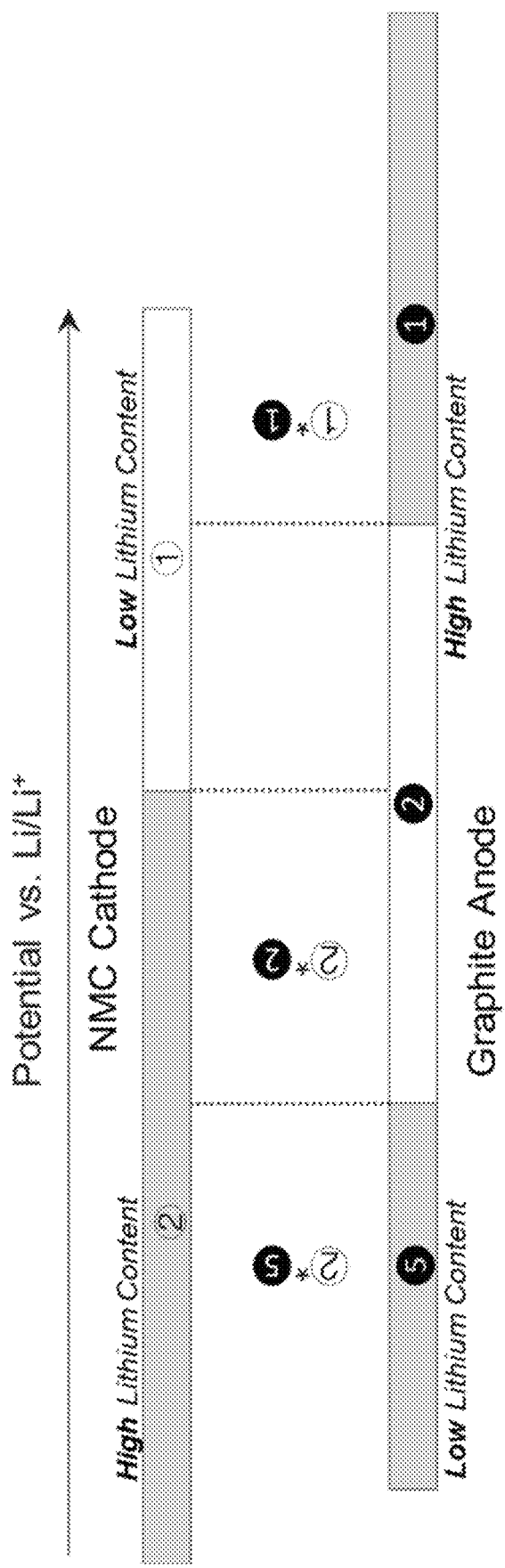
FIG. 6 is a representative diagram showing an insertion map of a NMC-Graphite Li-ion battery.

In various embodiments, the method 200 includes monitoring the one or more peaks, such as their reduction in magnitude along the incremental capacity axis (e.g., y-axis of FIG. 5) or shift in position along the voltage axis (e.g., x-axis of FIG. 5). In certain embodiments, reduction in magnitude along the incremental capacity axis indicates a loss in rechargeable battery capacity, which is indicative of battery aging; whereas shift in position along the voltage axis, such as towards higher voltage (e.g., increase in overpotential) indicates increase in battery internal resistance, which is also indicative of battery aging.

Figure 7:
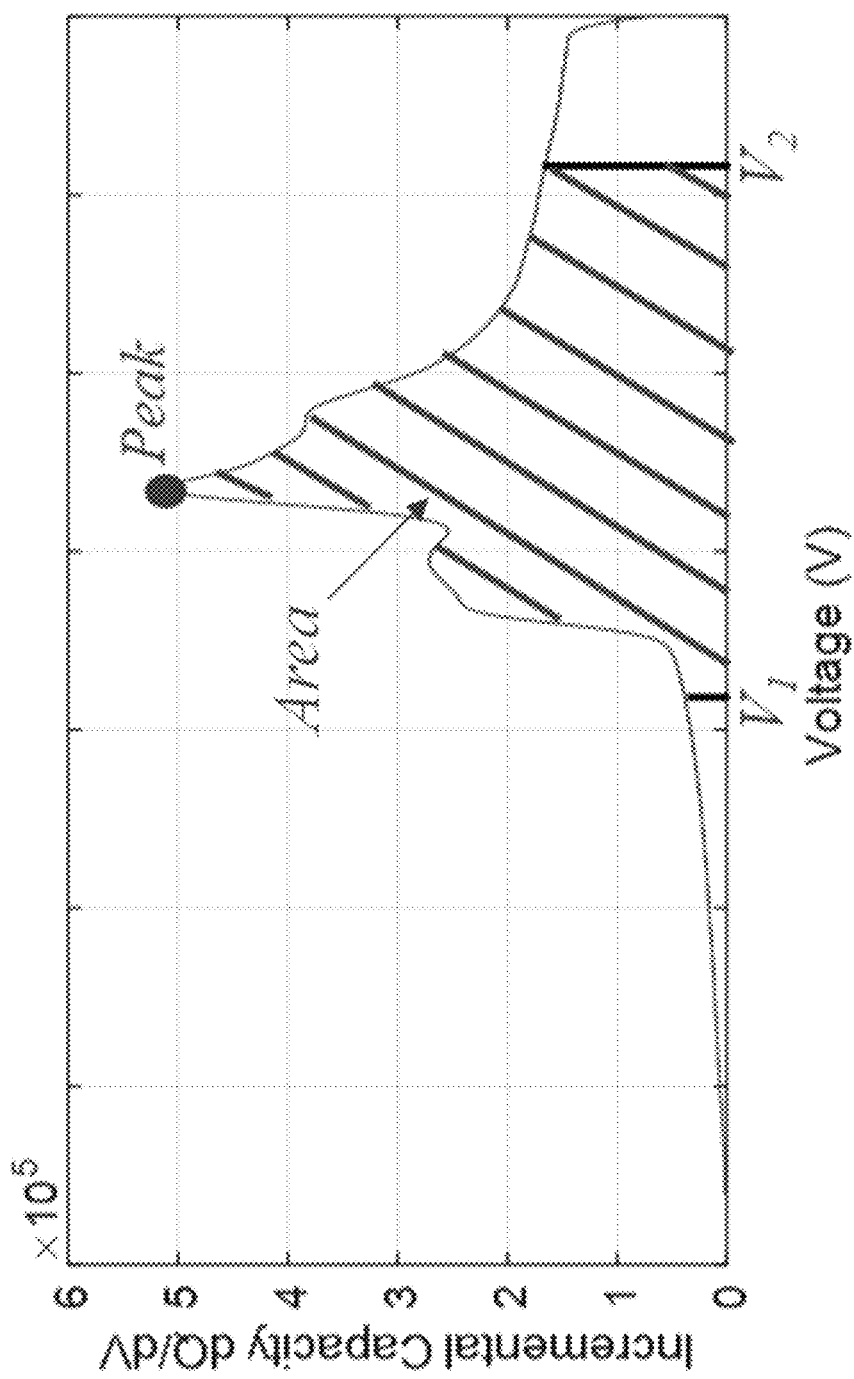
FIG. 7 is a representative diagram showing an ICA area and/or an ICA peak of the smoothened IC data of FIG. 5.

In various embodiments, the process 240 of extracting an ICA area and/or an ICA peak from the IC data includes extracting a peak value of the IC curve (e.g., the smoothened IC curve) to be the ICA peak and extracting an area value of the IC curve to be the ICA area. FIG. 7 is a representative diagram showing an ICA area and/or an ICA peak of the smoothened IC data of FIG. 5. In some examples, the ICA peak corresponds to the highest peak of the IC curve. In certain examples, the ICA peak corresponds to a peak of the IC curve within a predetermined voltage range, such as within a first voltage value ($V_1$) and a second voltage value ($V_2$). In certain examples, the ICA area is the area under the IC curve within the predetermined voltage range, such as within $V_1$ and $V_2$. In various examples, multiple ICA peaks and multiple ICA areas are extracted from an ICA curve.

In various embodiments, the process 250 of inputting the extracted ICA area and/or the ICA peak into an ICA database includes inputting the extracted ICA area and/or the ICA peak with respect to a SOH value corresponding to the battery health of the battery when the QV data is acquired, from which the ICA area and/or the ICA peak are extracted. In some examples, an ICA area is paired with an ICA peak, wherein the pair corresponds to one SOH of a battery.

Figure 8:
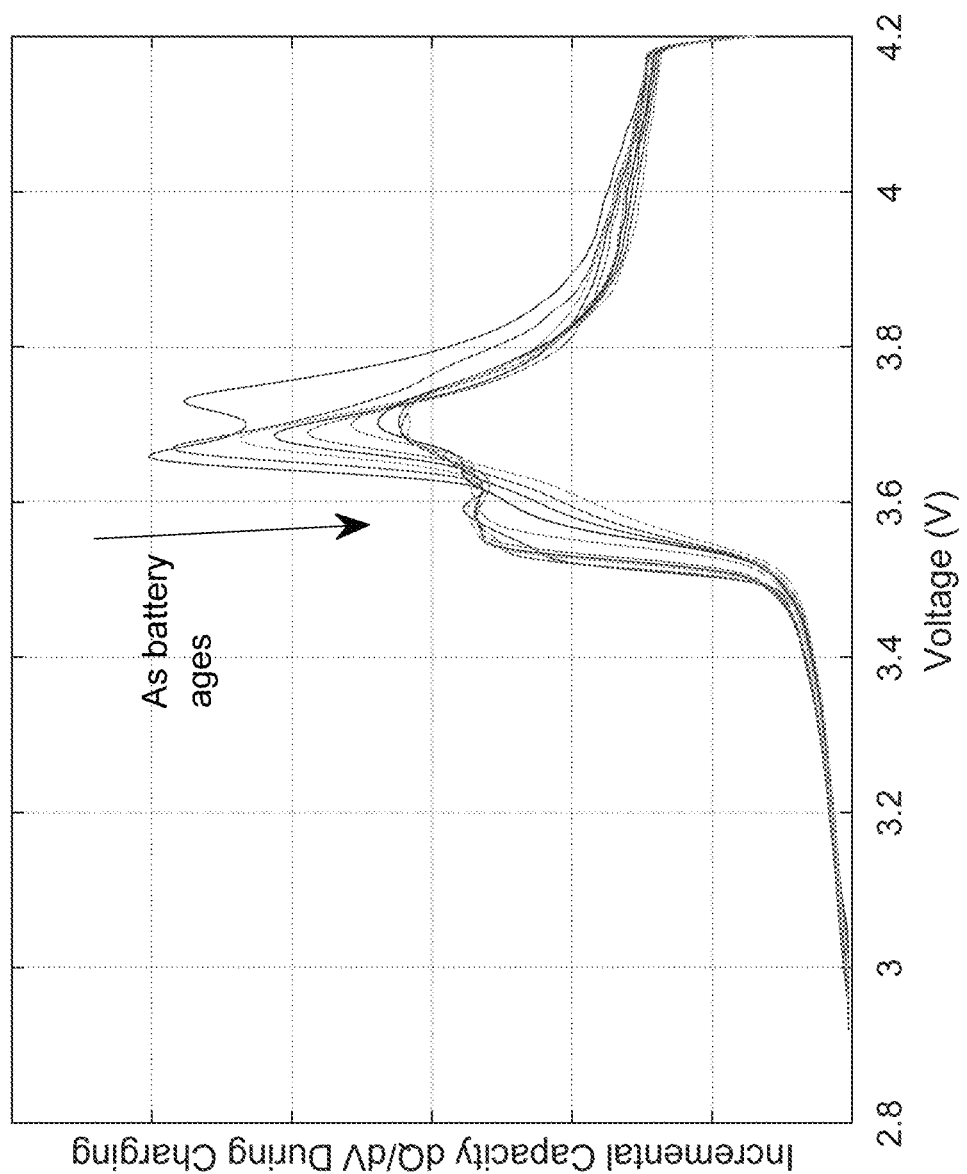
FIG. 8 is a representative diagram showing multiple IC data obtained based on at least multiple QV data acquired at multiple SOHs.

In various embodiments, the process 260 includes repeating a process of acquiring of another QV data at another SOH of the training battery within a predetermined voltage range during a charging cycle, a process of obtaining another IC data based on at least the another QV data, a process of pre-processing the another IC data, a process of extracting another ICA area and/or another ICA peak from the another IC data (e.g., smoothened), and a process of inputting the another ICA area and/or the another ICA peak into the ICA database. In some embodiments, performing the process 260 on the training battery includes acquiring multiple QV data at multiple SOHs of a training battery, obtaining multiple corresponding IC data, extracting multiple corresponding ICA areas and/or ICA peaks, and inputting the multiple corresponding ICA area and/or ICA peak into the database. As an example, FIG. 8 is a representative diagram showing multiple IC data obtained based on at least multiple QV data acquired at multiple SOHs of the same trained battery. As shown, as the battery ages, the magnitude of the ICA peak (e.g., the highest peak) reduces while overpotential increases, as indicated by the shift in peak position along the voltage axis towards the right. Notably, the second highest peak quickly disappears as the battery ages, indicating a loss in an electrochemical process, which further indicates a degraded battery. It is to be understood that FIGS. 3-8 are merely examples, which should not unduly limit the scope of the claims. One of ordinary skill in the art would recognize many variations (e.g., for other energy storage devices) without departing from the disclosed disclosure.

Figure 9:
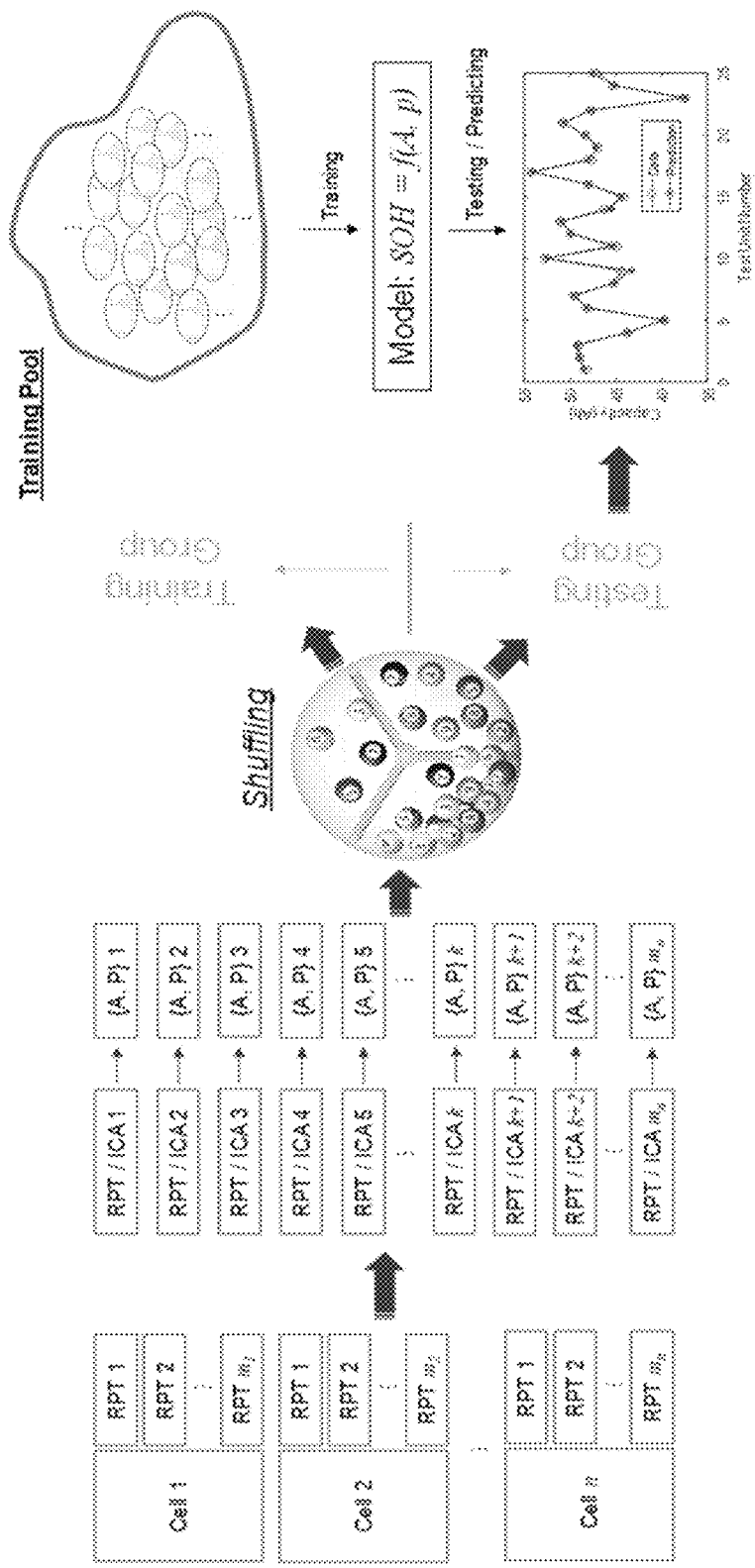
FIG. 9 is an illustrative diagram showing a method for establishing a trained SOH estimation model, according to some embodiments of the present disclosure.

In some embodiments, the process 260 optionally includes repeating a process of acquiring of another QV data at another SOH of one or more additional training batteries within a predetermined voltage range during a charging cycle, a process of obtaining another IC data based on at least the another QV data, a process of pre-processing the another IC data, a process of extracting another ICA area and/or another ICA peak from the another IC data (e.g., smoothened), and a process of inputting the another ICA area and/or the another ICA peak into the ICA database. In some embodiments, performing the process 260 on the one or more additional training battery includes acquiring multiple QV data at multiple SOHs of the one or more additional training batteries, obtaining multiple corresponding IC data, extracting multiple corresponding ICA areas and/or ICA peaks, and inputting the multiple corresponding ICA area and/or ICA peak into the database. FIG. 9 is an illustrative diagram showing a method for establishing a trained SOH estimation model, according to some embodiments of the present disclosure. In some examples, obtaining QV data of the one or more additional training batteries includes obtaining QV data at multiple testing conditions, where each of the one or more additional training batteries is tested at a different testing condition and/or each of the one or more additional training batteries is tested (e.g., sequentially) at more than one testing condition. In certain examples, the multiple testing conditions includes multiple testing temperatures (e.g., of the battery and/or of the testing environment), multiple input currents, multiple depth of discharges, multiple humidity levels of the testing environment.

In certain embodiments, the training battery and optionally the one or more additional training batteries is of a first battery type (e.g., a rechargeable or secondary battery), and the trained SOH estimation model is established to predict (e.g., only predict) a predicted SOH of a battery of the first battery type. Such a trained SOH estimation model may be referred to as a type-specific model. In various examples, the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

As shown in FIG. 9, starting from the left side of the illustration, multiple training batteries (i.e., cell 1, cell 2 . . . cell n) are examined, with each training battery being examined for multiple tests (i.e., RPT 1, RPT 2 . . . RPT m). In some examples, each test is performed at a different SOH to obtain a IC data from which a corresponding IC area and a corresponding IC peak are extracted. Once the IC areas and IC peaks are extracted for the multiple tests and multiple cells, they are inputted into an ICA database.

Further referring to FIG. 9, in certain embodiments, the process 270 of establishing the trained SOH estimation model by training and testing a base SOH estimation model based on at least the ICA database using Support Vector Regression includes shuffling the ICA database, forming a training group and a testing group, training a base SOH estimation model using a of the training group, and testing each iterative model (e.g., iterated from the based SOH estimation model) and modifying one or more SVR parameters until a satisfactory trained SOH estimation model is established. In certain examples, the training and testing is performed (e.g., alternatively) until an iterative SOH estimation model achieves a predetermined performance target. In some examples, the predetermined performance target includes a confidence level, accuracy level, and/or speed. In certain examples, once an iterative SOH estimation model satisfies the predetermined performance target, the iterative SOH estimation model is selected as the trained SOH estimation model.

Returning to FIG. 1, the process 120 of acquiring a QV data of a battery at a to-be-determined state of health (TBD-SOH) includes measuring the QV data including battery voltage data and corresponding battery capacity data of the battery (e.g., an on-board battery) within a predetermined voltage range during a charging cycle. For example, measuring the QV data of the battery is performed by a BMS. In certain examples, the charging cycle is a constant current charging cycle. In certain alternative embodiments, the process 210 includes acquiring the QV data of the training battery during a discharging cycle (e.g., a constant current discharging cycle).

In various embodiments, the process 130 of obtaining an IC data based on the acquired QV data includes differentiating the acquired battery capacity over the battery voltage, such as taking a first derivative of a QV curve of a QV data:

$$\frac{dQ}{dV} = \frac{\Delta Q}{\Delta V} = \frac{Q_k - Q_{k-1}}{V_k - V_{k-1}}$$

where k is selected from a range of 1 to K, where K is the total number of QV data-pairs.

In various embodiments, the process 140 of pre-processing the obtained IC data includes smoothening the IC data. In some examples, smoothening the IC data is performed using a gaussian smoothening algorithm. In certain examples, smoothening the IC data includes reducing noise, removing outliers, and/or altering the curve based on a pre-processing model (e.g., an artificial intelligence model).

In various embodiments, the process 150 of extracting an ICA area and/or an ICA peak from the obtained IC data includes extracting a peak value of the IC curve (e.g., the smoothened IC curve) to be the ICA peak and extracting an area value of the IC curve to be the ICA area. In some examples, the ICA peak corresponds to the highest peak of the IC curve. In certain examples, the ICA peak corresponds to a peak of the IC curve within a predetermined voltage range, such as within a first voltage value ($V_1$) and a second voltage value ($V_2$). In certain examples, the ICA area is the area under the IC curve within the predetermined voltage range, such as within $V_1$ and $V_2$. In various examples, multiple ICA peaks and multiple ICA areas are extracted from an ICA curve.

In various embodiments, the process 160 of predicting a P-SOH corresponding to the TBD-SOH based on at least analyzing the extracted ICA area and/or ICA peak using the trained SOH estimation model includes using a trained SOH estimation model established according to method 200. In some examples, the P-SOH is a value (e.g., P-SOH=80%). In other examples, the P-SOH is a range (e.g., a range smaller or equal to 20%, 10%, 5%, or 1%, for example, P-SOH=80%-85%). In certain examples, the process 160 of predicting the P-SOH is performed automatically, such as by a system for predicting a P-SOH.

Figure 10:
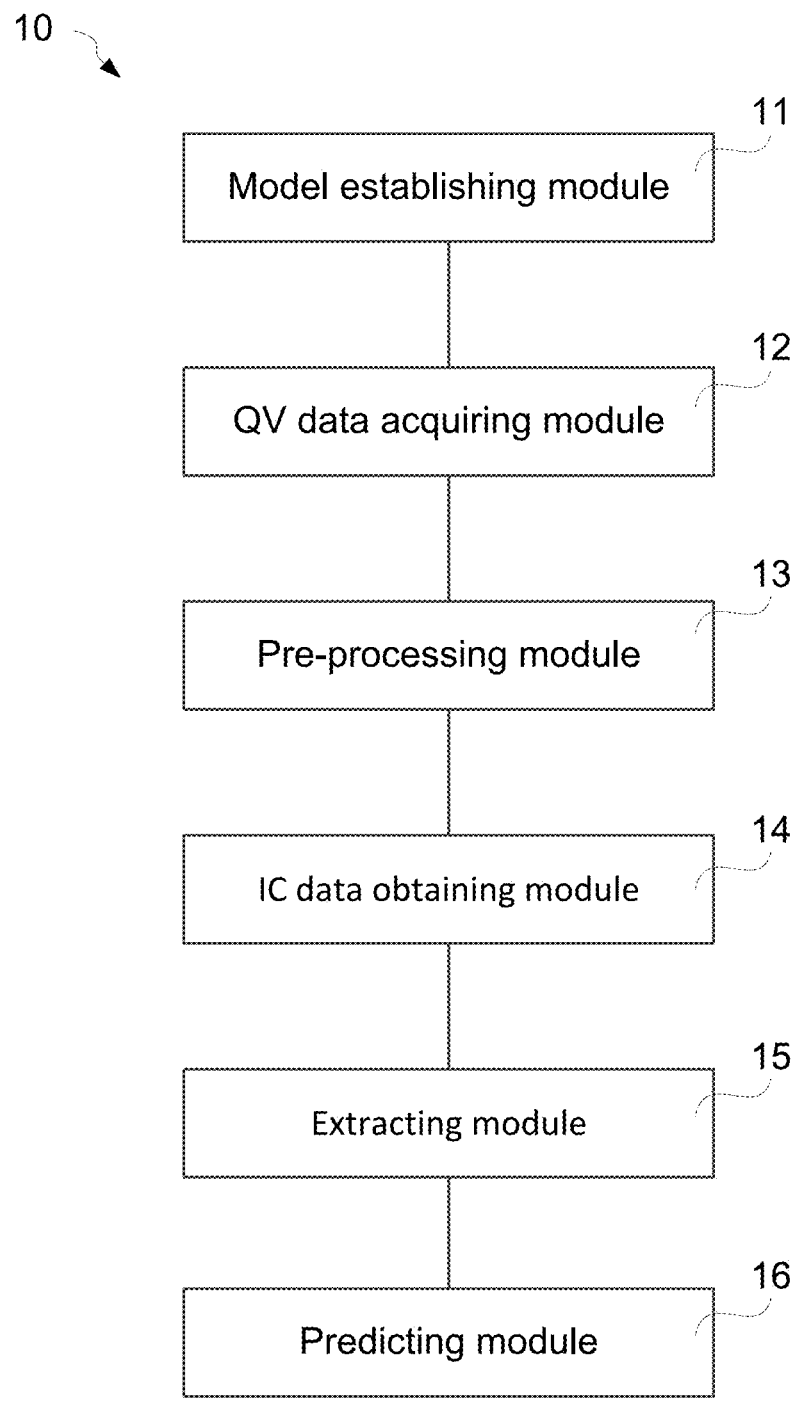
FIG. 10 is a simplified diagram showing a system for predicting a predicted state of health of a battery, according to some embodiments of the present disclosure.

FIG. 10 is a simplified diagram showing a system 10 for predicting a P-SOH, according to some embodiments of the present disclosure. This diagram is merely an example, which should not unduly limit the scope of the claims. One of ordinary skill in the art would recognize many variations, alternatives, and modifications. In some examples, the system 10 includes a model establishing module 11, a QV data acquiring module 12, a pre-processing module 13, an IC data obtaining module 14, an extracting module 15, and a predicting module 16. Although the above has been shown using a selected group of components for the system, there can be many alternatives, modifications, and variations. For example, some of the components may be expanded and/or combined. Other components may be inserted to those noted above. Depending upon the embodiment, the arrangement of components may be interchanged with others replaced.

In various embodiments, the system 10 is configured to perform the method 100, the model establishing module 11 is configured to perform the process 110 of establishing a trained SOH estimation model, the QV data acquiring module 12 is configured to perform the process 120 of acquiring a QV data of a battery at a TBD-SOH, the pre-processing module 13 is configured to perform the process 130 of obtaining an IC data based on the acquired QV data, the IC data obtaining module 14 is configured to perform the process 140 of pre-processing the obtained IC data, the extracting module 15 is configured to perform the process 150 of extracting an ICA area and/or an ICA peak from the obtained IC data, and/or the predicting module 16 is configured to perform the process 160 of predicting the P-SOH corresponding to the TBD-SOH based on at least analyzing the extracted ICA area and/or ICA peak using the trained SOH estimation model.

Figure 11:
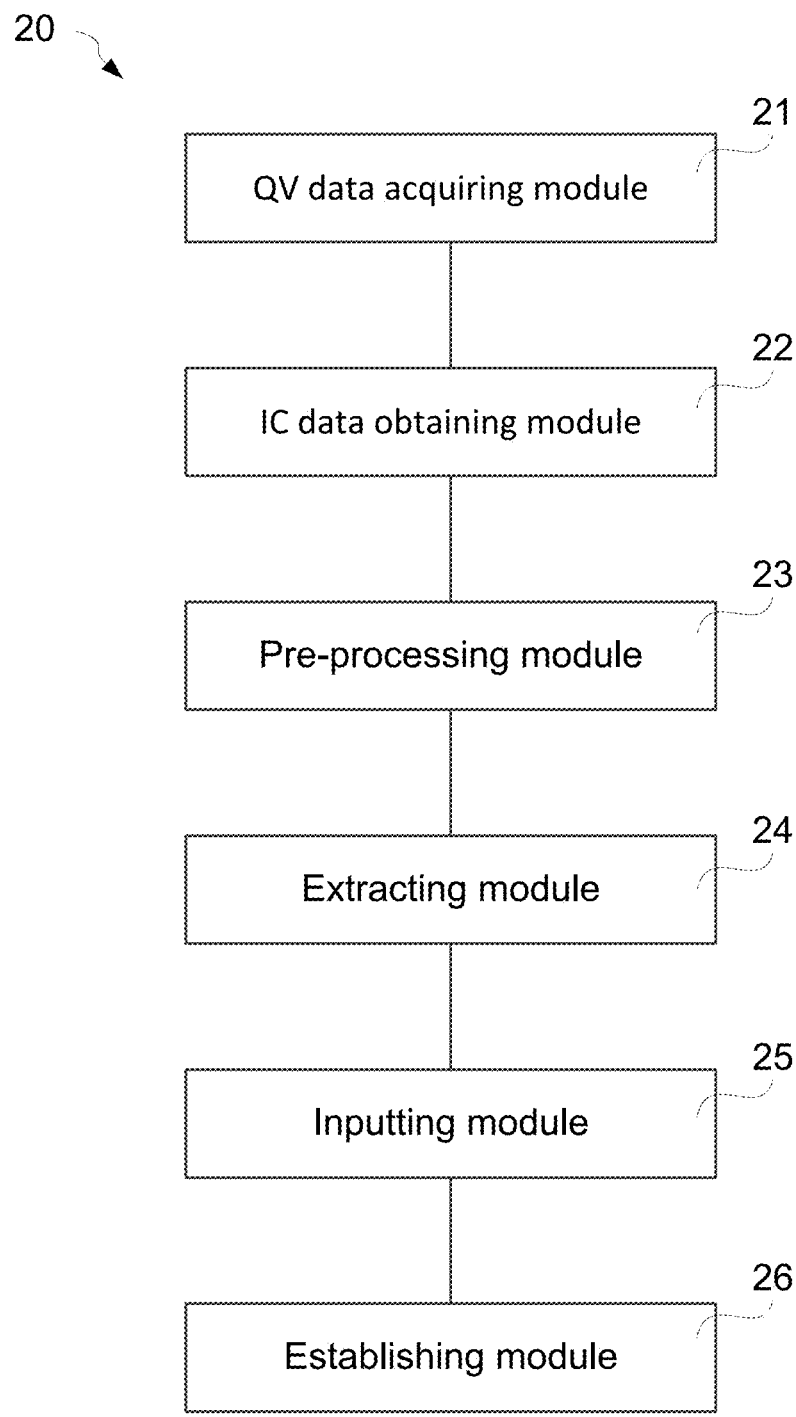
FIG. 11 is a simplified diagram showing a system for establishing a trained state of health (SOH) estimation model, according to some embodiments of the present disclosure.

FIG. 11 is a simplified diagram showing a system 20 for establishing a trained SOH estimation model, according to some embodiments of the present disclosure. This diagram is merely an example, which should not unduly limit the scope of the claims. One of ordinary skill in the art would recognize many variations, alternatives, and modifications. In some examples, the system 20 includes a QV data acquiring module 21, an IC data obtaining module 22, a pre-processing module 23, an extracting module 24, an inputting module 25, and an establishing module 26. Although the above has been shown using a selected group of components for the system, there can be many alternatives, modifications, and variations. For example, some of the components may be expanded and/or combined. Other components may be inserted to those noted above. Depending upon the embodiment, the arrangement of components may be interchanged with others replaced.

In various embodiments, the system 20 is configured to perform the method 200, the QV data acquiring module 21 is configured to perform the process 210 of acquiring a QV data of a training battery at a first SOH within a predetermined voltage range during a charging cycle, the IC data obtaining module 22 is configure to perform the process 220 of obtaining an IC data based on at least the acquired QV data, the pre-processing module 23 is configured to perform the process 230 of pre-processing the IC data, the extracting module 24 is configured to perform the process 240 of extracting an ICA area and/or an ICA peak from the IC data, the inputting module 25 is configured to perform the process 250 of inputting the extracted ICA area and the ICA peak into an ICA database, and/or the establishing module 26 is configured to perform the process 270 of establishing the trained SOH estimation model by training and testing a base SOH estimation model based on at least the ICA database using Support Vector Regression. In some examples, the system 20 is configured to perform the process 260 of repeating the acquiring, the obtaining, the pre-processing, the extracting, and the inputting processes on the training battery at one or more additional SOHs and optionally on one or more additional training batteries at multiple SOHs, such as by using the QV data acquiring module 21, the IC data obtaining module 22, the pre-processing module 23, the extracting module 24, and the inputting module 25.

In some examples, acquiring a QV data of a battery includes connecting and/or enabling a pre-established connection with a battery test equipment, such as a potentiostat. In various examples, acquiring a QV data of a battery includes providing current, if during a charging cycle, or extracting current, if during a discharging cycle, from an initial working voltage to a target voltage. In various embodiments, determining SOH of a battery, such as of the training battery for establishing the SOH estimation model, includes monitoring cell impedance, cell conductance, capacity loss from an pre-recorded initial state, charge-discharge energy ratio, charging and discharging voltage curves such as overpotential or plateau voltage, rate and/or magnitude of self-discharge, and/or outgassing. In some examples, smoothening IC data includes removing outliers deviating from the remaining of the data points that fall within a predetermined acceptable denoising range.

Additional examples within the scope of the disclosure are listed below.

Example 1. A computer-implemented method for establishing a trained state of health (SOH) estimation model comprises: acquiring a voltage vs. capacity (QV) data of a training battery at a first SOH within a predetermined voltage range during a charging cycle; obtaining an incremental capacity (IC) data based on at least the acquired QV data; extracting an ICA area and/or an ICA peak from the IC data; inputting the extracted ICA area and the ICA peak into an ICA database; repeating the acquiring, the obtaining, the extracting, and the inputting processes on the training battery at one or more additional SOHs and optionally on one or more additional training batteries at multiple SOHs; and establishing the trained SOH estimation model by training and testing a base SOH estimation model based on at least the ICA database using Support Vector Regression. In some examples, the method is implemented according to method 200 of FIG. 2. In certain examples, the method is implemented by system 20 of FIG. 11.

Example 2. The computer-implemented method further includes pre-processing the IC data after the process of obtaining the IC data and before the process of extracting the ICA area/or and the ICA peak from the IC data.

Example 3. The computer-implemented method of example 2, wherein the pre-processing the IC data includes smoothening the IC data.

Example 4. The computer-implemented method of any of examples 1 to 3, wherein the obtaining the IC data based on at least the acquired QV data includes differentiating the acquired capacity over the acquired voltage.

Example 5. The computer-implemented method of any of examples 1 to 4, wherein the extracting an ICA area and/or an ICA peak from the IC data includes: extracting multiple ICA secondary areas and multiple secondary ICA secondary peaks from the IC data, wherein each of the multiple ICA secondary areas corresponds to one of the multiple secondary ICA secondary peaks.

Example 6. The computer-implemented method of any of examples 1 to 5, wherein the training battery and optionally the one or more additional training batteries is of a first battery type. In some examples, the trained SOH estimation model is established to predict a predicted SOH of a battery of the first battery type.

Example 7. The computer-implemented method of example 6, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 8. A system for establishing a trained SOH estimation model comprises: a QV data acquiring module configured to obtain a QV data of a training battery at a first SOH within a predetermined voltage range during a charging cycle; an IC data obtaining module configured to obtain an IC data based on at least the acquired QV data; an extracting module configured to extract an ICA area and/or an ICA peak from the IC data; an inputting module configured to input the extracted ICA area and the ICA peak into an ICA database; and an establishing module configured to establish the trained SOH estimation model by training and testing a base SOH estimation model based on at least the ICA database using Support Vector Regression. In some examples, the system is implemented according to system 20 of FIG. 11.

Example 9. The system of example 8, wherein the system further includes a pre-processing module configured to pre-process the IC data.

Example 10. The system of example 9, wherein the pre-processing module is configured to smoothen the IC data.

Example 11. The system of any of examples 8 to 10, wherein the extracting module is further configured to extract multiple ICA secondary areas and multiple secondary ICA secondary peaks from the IC data, wherein each of the multiple ICA secondary areas corresponds to one of the multiple secondary ICA secondary peaks.

Example 12. The system of any of examples 8 to 11, wherein the training battery and optionally the one or more additional training batteries is of a first battery type, and wherein the establishing module is configured to establish the trained SOH estimation model to predict a predicted SOH of a battery of the first battery type.

Example 13. The system of any of example 12, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 14. A non-transitory computer-readable medium with instructions stored thereon, that when executed by a processor, cause the processor to perform processes including: acquiring a QV data of a training battery at a first SOH within a predetermined voltage range during a charging cycle; obtaining an IC data based on at least the acquired QV data; extracting an ICA area and/or an ICA peak from the IC data; inputting the extracted ICA area and/or the ICA peak into an ICA database; repeating the acquiring, the obtaining, the extracting, and the inputting processes on the training battery at one or more additional SOHs and optionally on one or more additional training batteries at multiple SOHs; and establishing the trained SOH estimation model by training and testing a base SOH estimation model based on at least the ICA database using Support Vector Regression.

Example 15. The non-transitory computer-readable medium of example 14, when executed by the processor, further performs the process of pre-processing the IC data after the process of obtaining the IC data and before the process of extracting the ICA area and/or the ICA peak from the IC data.

Example 16. The non-transitory computer-readable medium of example 15, wherein the pre-processing the IC data includes smoothening the IC data.

Example 17. The non-transitory computer-readable medium of any of examples 14-16, wherein the obtaining the incremental capacity (IC) data based on at least the acquired QV data includes differentiating the acquired capacity over the acquired voltage.

Example 18. The non-transitory computer-readable medium of any of examples 14-17, when executed by the processor, further performs the process of extracting multiple ICA secondary areas and multiple secondary ICA secondary peaks from the IC data. In some examples, each of the multiple ICA secondary areas corresponds to one of the multiple secondary ICA secondary peaks.

Example 19. The non-transitory computer-readable medium of any of examples 14-18, wherein the training battery and optionally the one or more additional training batteries is of a first battery type, and wherein the non-transitory computer-readable medium when executed by the processor, performs the process of establishing the trained SOH estimation model including establishing the trained SOH estimation model to predict a predicted SOH of a battery of the first battery type.

Example 20. The non-transitory computer-readable medium of example 19, wherein the first battery type is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 21. A computer-implemented method for predicting a predicted state of health (P-SOH) of a battery includes: establishing a trained state of health (SOH) estimation model; acquiring a voltage vs. capacity (QV) data of the battery at a to-be-determined state of health (TBD-SOH) within a predetermined voltage range during a charging cycle; obtaining an incremental capacity (IC) data based on at least the acquired QV data; extracting an ICA area and/or an ICA peak from the IC data; and predicting the predicted SOH (P-SOH) corresponding to the TBD-SOH based on at least analyzing the extracted ICA area and/or ICA peak using the trained SOH estimation model.

Example 22. The computer-implemented method of example 21, further includes pre-processing the IC data after the process of obtaining the IC data and before the process of extracting the ICA area and the ICA peak from the IC data.

Example 22. The computer-implemented method of example 22, wherein the pre-processing the IC data may include smoothening the IC data.

Example 23. The computer-implemented method of any of examples 20 to 22, wherein the pre-processing the IC data includes smoothening the IC data.

Example 24. The computer-implemented method of any of examples 20 to 23, wherein the obtaining the IC data based on at least the acquired QV data includes differentiating the acquired capacity over the acquired voltage.

Example 25. The computer-implemented method of any of examples 20 to 24, wherein the extracting an ICA area and an ICA peak from the IC data includes: extracting multiple ICA secondary areas and multiple secondary ICA secondary peaks from the IC data, wherein each of the multiple ICA secondary areas corresponds to one of the multiple secondary ICA secondary peaks.

Example 26. The computer-implemented method of any of examples 20 to 25, wherein the battery is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 27. A system for predicting a predicted state of health (P-SOH) of a battery, the method comprising: a model establishing module configured to establish a trained state of health (SOH) estimation model; a voltage vs. capacity (QV) data acquiring module configured to obtain a QV data of the battery at a to-be-determined state of health (TBD-SOH) within a predetermined voltage range during a charging cycle; an incremental capacity (IC) data obtaining module configured to obtain an incremental capacity (IC) data based on at least the acquired QV data; an extracting module configured to extract an ICA area and/or an ICA peak from the IC data; and a predicting module configured to predict the predicted SOH (P-SOH) corresponding to the TBD-SOH based on at least analyzing the extracted ICA area and/or ICA peak using the trained SOH estimation model.

Example 28. The system of example 27, further includes a pre-processing module configured to pre-process the IC data.

Example 29. The system of example 28, wherein the pre-processing module is configured to smoothen the IC data.

Example 30. The system of any of examples 27 to 29, wherein the extracting module is further configured to extract multiple ICA secondary areas and multiple secondary ICA secondary peaks from the IC data. In some examples, each of the multiple ICA secondary areas corresponds to one of the multiple secondary ICA secondary peaks.

Example 31. The system of any of examples 27 to 30, wherein the battery is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

Example 32. A non-transitory computer-readable medium with instructions stored thereon, that when executed by a processor, cause the processor to perform processes including: establishing a trained state of health (SOH) estimation model; acquiring a voltage vs. capacity (QV) data of the battery at a to-be-determined state of health (TBD-SOH) within a predetermined voltage range during a charging cycle; obtaining an IC data based on at least the acquired QV data; extracting an ICA area and/or an ICA peak from the IC data; and predicting the predicted SOH (P-SOH) corresponding to the TBD-SOH based on at least analyzing the extracted ICA area and/or ICA peak using the trained SOH estimation model.

Example 33. The non-transitory computer-readable medium of example 32, when executed by the processor, further performs the process of pre-processing the IC data after the process of obtaining the IC data and before the process of extracting the ICA area and the ICA peak from the IC data.

Example 34. The non-transitory computer-readable medium of example 33, wherein the pre-processing the IC data includes smoothening the IC data.

Example 35. The non-transitory computer-readable medium of any of examples 32 to 34, wherein the obtaining the incremental capacity (IC) data based on at least the acquired QV data includes differentiating the acquired capacity over the acquired voltage.

Example 36. The non-transitory computer-readable medium of any of examples 32 to 35, when executed by the processor, further performs the process of extracting multiple ICA secondary areas and multiple secondary ICA secondary peaks from the IC data. In some examples, each of the multiple ICA secondary areas corresponds to one of the multiple secondary ICA secondary peaks.

Example 37. The non-transitory computer-readable medium of any of examples 32 to 36, the battery is one selected from a group consisting of lithium-ion battery, sodium-ion battery, supercapacitor, fuel cell, flow battery, metal-air battery, molten salt battery, nickel metal hydride battery, sodium-sulfur battery, and lead-acid battery.

In certain embodiments, ICA analysis is performed during a charging cycle such that issues associated with dynamic lithiation and de-lithiation may be minimized. Additionally, the charging rage used during ICA analysis, $I_{ICA}$, which may be measured in C-rate, $C_{ICA}$, is generally lower than a normal charging rate $I_{normal}$ at which the battery is normally charged at during regular duty cycles when implemented in a target application (e.g., electric vehicle, stationary storage, portable electronic devices), which may be measured in C-rate, $C_{normal}$, to help keep the battery near equilibrium to improve accuracy in obtaining good ICA peak(s). To further improve the ICA analysis process, the charging cycle may be tailored to increase efficiency and/or speed while maintaining accuracy.

In some examples, ICA analysis is implemented in an electrified vehicle such as a hybrid vehicle or an electric vehicle. The electrified vehicle includes one or more batteries for powering the electrified vehicle and may be coupled to an external power source, such as be plugged into an electrical outlet to be connected to a local power system or a power grid system for an electrification process. The electrification process may include electricity generation, electric power distribution, and/or power management, including regulating battery temperature, charging and discharging, and/or changing one or more battery operational limits. In some examples, ICA analysis may be performed by an on-board power estimator located on the electrified vehicle. For example, the on-board power estimator may be part of a battery management system coupled to a vehicle controller. In other examples, ICA analysis may be performed by an external power estimator that may be coupled to the one or more batteries during charging and/or discharging.

In some examples, the SOC of a battery (e.g., of an electrified vehicle) may be determined using a coulomb counting technique. An exemplary $SOC_{Ah}$ can be defined as shown in expression (1) below.

$$SOC_{Ah}(t) = SOC_0 - \frac{\int_{t_0}^{t} I(t)dt}{\text{Capacity}} \quad (1)$$

where I(t) is an input current during time t, $SOC_0$ denotes an initial SOC at an initial time of $t_0$, and Capacity denotes a present total capacity generated by the battery.

Figure 12:
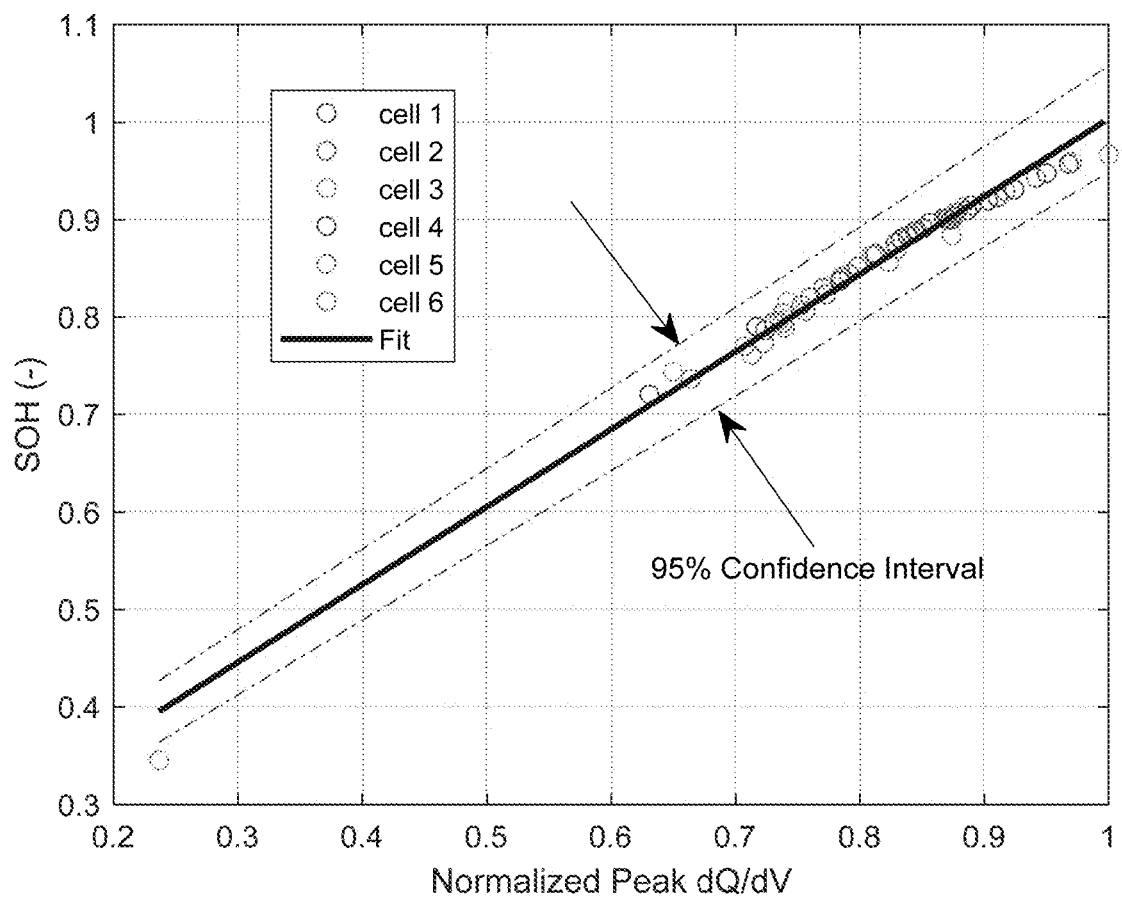
FIG. 12 is a simplified diagram showing correlation between SOH and IC data at ICA peaks for multiple test batteries, according to some embodiments.

FIG. 12 is a simplified diagram showing correlation between SOH and IC data at ICA peaks for multiple test batteries, according to some embodiments. In some examples, the state of health (SOH) estimation model is established, trained, and/or configured to predict SOH value and/or SOH range (e.g., depending on confidence interval) of a battery based at least in part upon ICA peaks of the battery. In certain examples, SOH of a battery may correspond to normalized ICA peak such that 100% SOH corresponds to an ICA peak of unity. In various examples, the SOH estimation model is stored at a server (e.g., an online server) and configured to be accessed by one or more clients via a wired connection or a wireless connection. For example, a client may transmit data corresponding to an ICA peak to the server hosting the SOH estimation model, the server then output an estimated SOH based on the ICA peak and transmit the estimated SOH to the client. In various embodiments, such improvement is achieved via adaptation of multi-stage charging cycle including multiple charging rates prior to entering the interested SOC range and/or voltage range for ICA analysis.

Figure 13A:
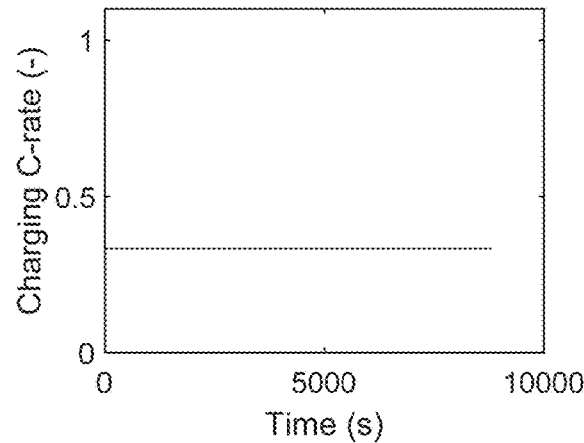
FIG. 13A is a simplified diagram showing charging of a test battery at a constant charging rate.
Figure 13B:
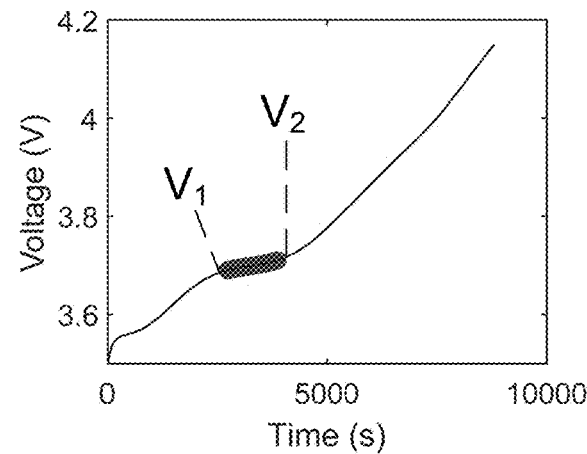
FIG. 13B is a simplified diagram showing voltage of a test battery during a charging cycle illustrated in FIG. 13A.
Figure 13C:
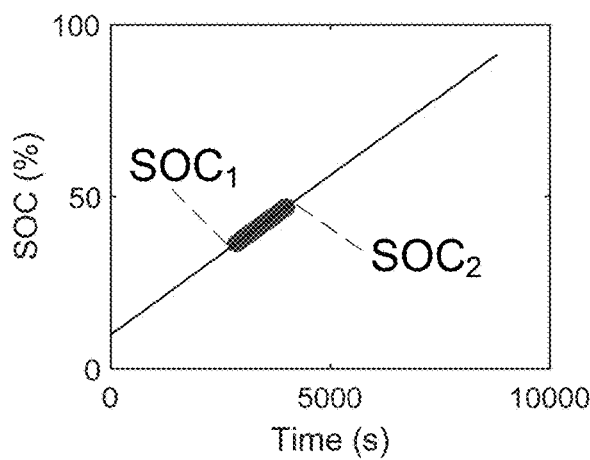
FIG. 13C is a simplified diagram showing state of charge of a test battery during a charging cycle illustrated in FIG. 13A.
Figure 13D:
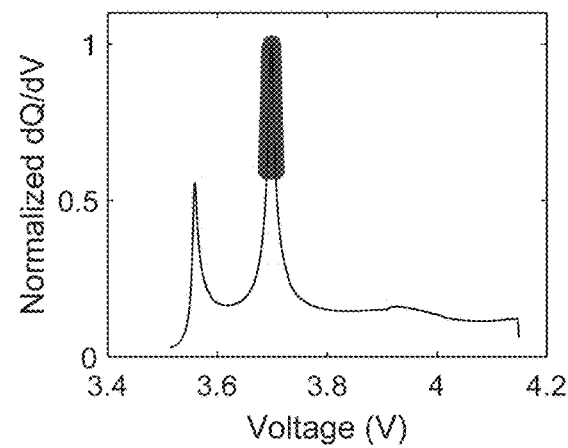
FIG. 13D is a simplified diagram showing IC data of a test battery during a charging cycle illustrated in FIG. 13A.

FIG. 13A is a simplified diagram showing charging of a test battery at a constant charging rate. As shown, the constant charging rate in this example is about ⅓ C, meaning it would take about 3 hours to fully charge a battery. FIG. 13B is a simplified diagram showing voltage of a test battery during a charging cycle illustrated in FIG. 13A. The highlighted voltage range corresponds to an interested voltage range for ICA analysis, specifically, from a first voltage $V_1$ (which may be referred to as the inflection voltage) to a second voltage $V_2$. FIG. 13C is a simplified diagram showing state of charge (SOC) of a test battery during a charging cycle illustrated in FIG. 13A. The highlighted SOC range corresponds to an interested SOC range for ICA analysis, specifically, from a first state of charge $SOC_1$ to a second state of charge $SOC_2$. In various examples, the first state of charge $SOC_1$ corresponds to the first voltage $V_1$ and the second state of charge $SOC_2$ corresponds to the second voltage $V_2$. FIG. 13D is a simplified diagram showing IC data of a test battery during a charging cycle illustrated in FIG. 13A. The highlighted IC data corresponds to an interested ICA peak, which corresponds to the interested voltage range and the interested SOC range.

Figure 14:
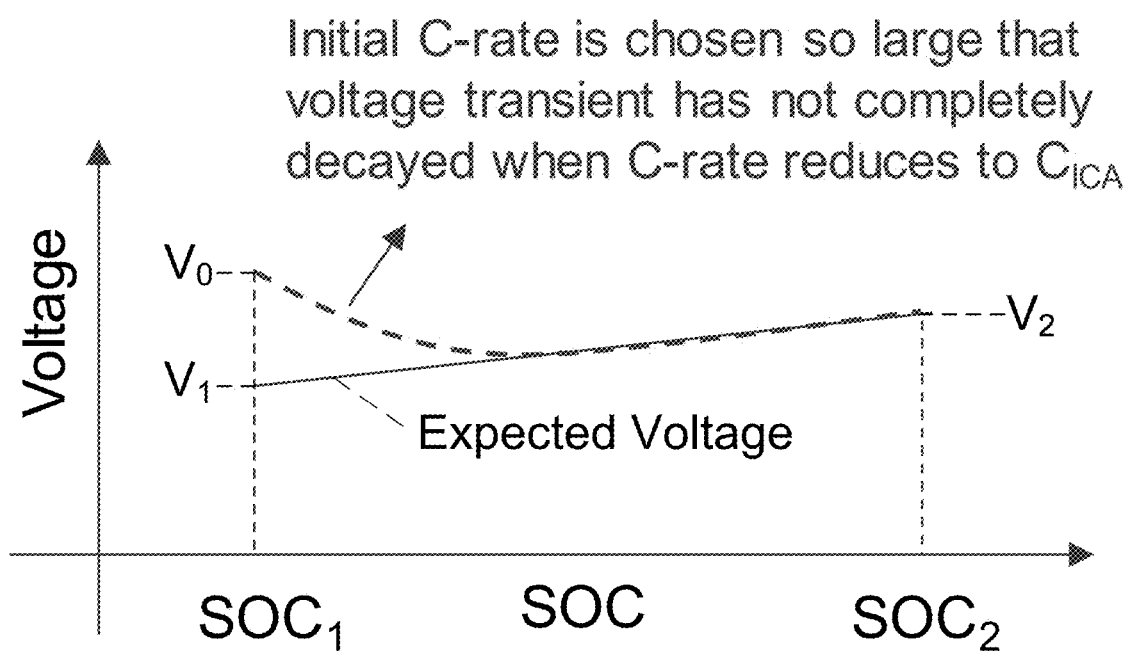
FIG. 14 is a simplified diagram showing an undesired ICA diagnosis charging cycle.

FIG. 14 is a simplified diagram showing an undesired ICA diagnosis charging cycle. As an example, when the charging rate (e.g., measured in C-rate) is too high when the battery enters the interest ICA analysis range, the working voltage $V_0$ may deviate from the first target voltage $V_1$, as shown in FIG. 14. This may correspond to voltage transient not having completely decayed when the battery reaches the first state of charge $SOC_1$. This is undesirable for obtaining accurate ICA data, which in various examples is critical to obtaining accurate SOH estimation for the battery. To mitigate and/or avoid such undesired transient response for a dynamic battery system, the charging rate(s) need to be carefully chosen such that transient response has decayed when the battery enters the range between $SOC_1$ and $SOC_2$, which in some examples, has an ICA charging rate of $I_{ICA}$.

Figure 15:
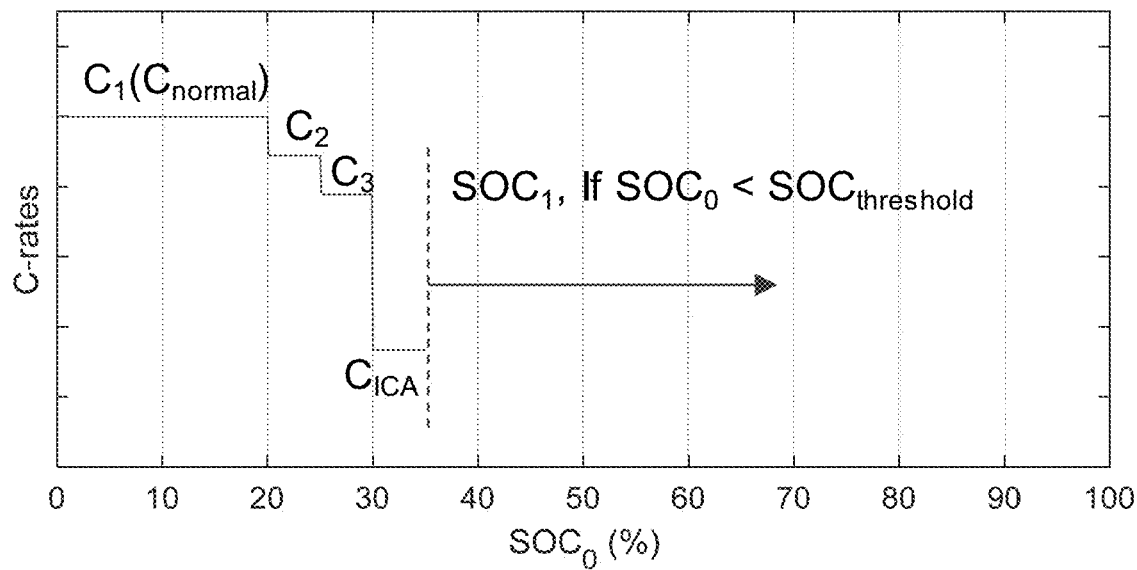
FIG. 15 is a simplified diagram showing a multi-stage charging cycle, according to some embodiments.

FIG. 15 is a simplified diagram showing a multi-stage charging cycle, according to some embodiments. A battery may be charged following the multiple charging rates illustrated in the multi-stage charging cycle to reduce or avoid the voltage transient issue illustrated in FIG. 14. Specifically, prior to switching to the charging rate of $I_{ICA}$ at $SOC_1$, the charging rate is changed multiple times, such as gradually, from a normal or initial charging rate of $C_1$ (e.g., $I_{normal}$ that corresponds to C-rate $C_{normal}$) to one or more smaller intermediate charging rates (e.g., C2 and C3), then finally to a final charging rate $I_f$ of ICA charging rate $I_{ICA}$ that corresponds to C-rate $C_{ICA}$. In various examples, the multi-stage charging cycle helps stabilizes a battery and to reach its equilibrium state, such that at $SOC_1$, the working voltage $V_0$ is substantially near the first target voltage $V_1$. For example, the multi-stage charging cycle helps avoid over-potential caused by concentration gradient, Ohmic resistance, concentration polarization, and/or poorly-formed solid electrolyte interface (SEI) layer. The amount of intermediate charging rates may be adjusted based on battery information such as battery condition.

Figure 16A:
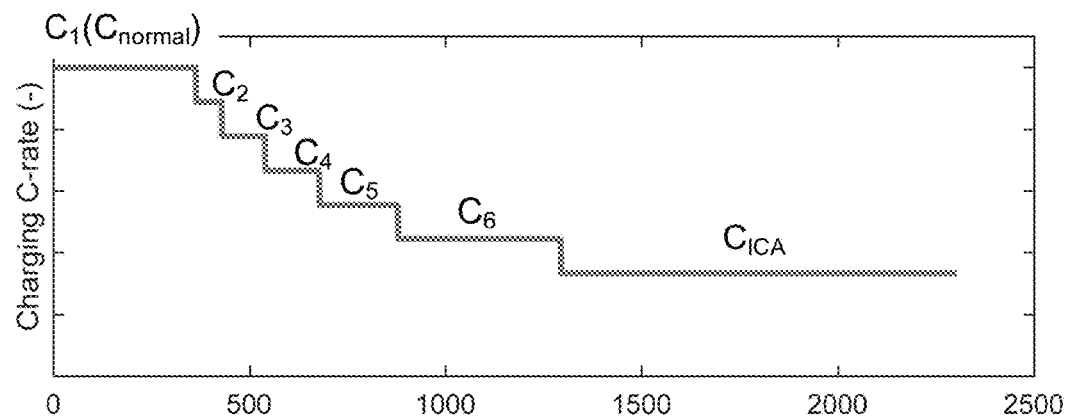
FIG. 16A is a simplified diagram showing multiple charging rates of a multi-stage charging cycle, according to some embodiments.
Figure 16B:
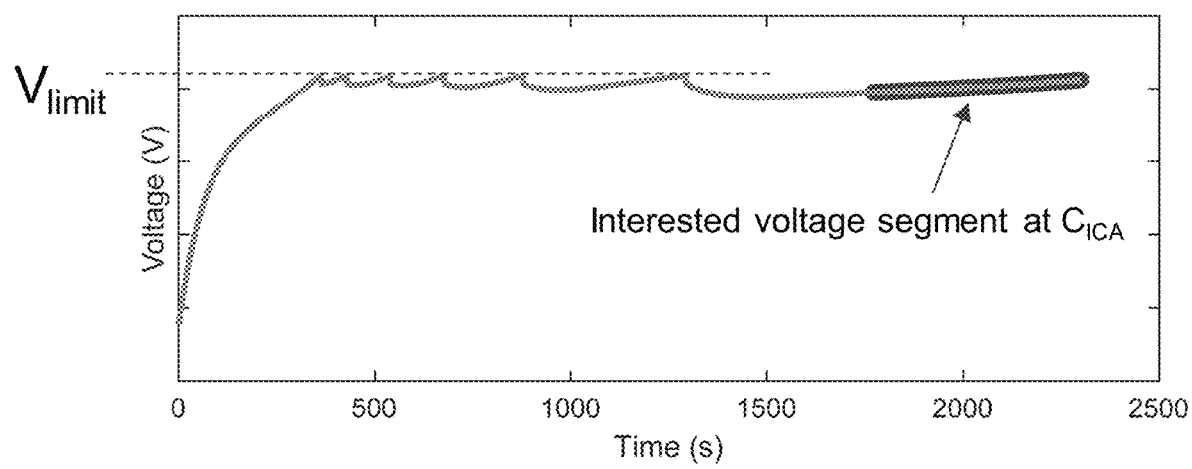
FIG. 16B is a simplified diagram showing voltage of a test battery charged at the multi-stage charging cycle illustrated in FIG. 16A, according to some embodiments.

FIG. 16A is a simplified diagram showing multiple charging rates of a multi-stage charging cycle, according to some embodiments. As shown, the multi-stage charging cycle includes a first initial charging rate of $C_1$ at $C_{normal}$, a final charging rate of $C_f$ at $C_{ICA}$, and five intermediate, gradually reducing charging rates of $C_2$, $C_3$, $C_4$, $C_5$, and $C_6$. FIG. 16B is a simplified diagram showing voltage of a test battery charged at the multi-stage charging cycle illustrated in FIG. 16A, according to some embodiments. As shown, the test battery is first charged at the normal charging rate of $C_{normal}$ when the battery voltage is low, such as when the state of charge of the battery is low. $C_{normal}$ may be higher than all intermediate charging rates and the final charging rate, and may be equal to a charging rate the battery is normally charged at during normal use for a given application when under duty (e.g., when implemented in an electrified vehicle). In certain examples, a voltage limit ($V_{limit}$) may be set for each stage of the multi-stage charging cycle such that when the voltage of the battery reaches $V_{limit}$, the charging rate is reduced to the subsequent charging rate (e.g., from $C_1$ to $C_2$) as designed. In some examples, the voltage limit may be set to the first target voltage $V_1$ of the interest voltage range for ICA analysis. As illustrated, the final charging rate before entering the interested SOC range for Ica analysis may equal to the ICA charging rate $I_{ICA}$ at $C_{ICA}$ such that the charging rate remains the same entering the interested SOC range. In various examples, the final charging rate is lower than all intermediate charging rates and the initial charging rate of the multi-stage charging cycle. In certain examples, the final charging rate is slightly above the Ica charging rate.

Figure 17A:
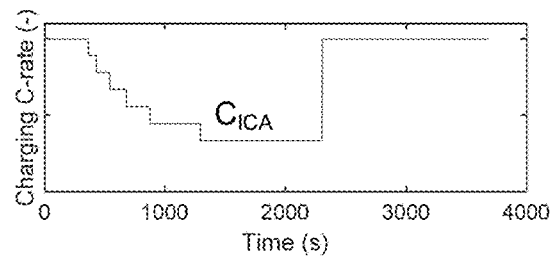
FIG. 17A is a simplified diagram showing multiple charging rates of a multi-stage charging cycle, according to some embodiments.

FIG. 17A is a simplified diagram showing multiple charging rates of a multi-stage charging cycle, according to some embodiments. As shown, the multi-stage charging cycle includes multiple charging rates that gradually, step-wise, reduce from an initial, normal charging rate, to an ICA charging rate at $C_{ICA}$, then returns back to the normal charging rate after the ICA analysis is completed. FIG. 17B is a simplified diagram showing voltage of the test battery charged at the multi-stage charging cycle illustrated in FIG. 17A, according to some embodiments. Corresponding to the charging rate diagram of FIG. 17A, the test battery is charged at multiple, gradually, step-wise, reducing charging rates. The selected voltage range within the square in FIG. 17B may correspond to FIG. 16B. The highlighted voltage range towards the end of the selected voltage range corresponds to the interested voltage range for ICA analysis. As shown, the corresponding charging rate at the interested voltage range is at $C_{ICA}$, a low charging current for increased ICA analysis accuracy. FIG. 17C is a simplified diagram showing IC data of the test battery charged at the multi-stage charging cycle illustrated in FIG. 17A, according to some embodiments. The voltage range, and thus the SOC range, may be selected to be substantially small to save time while maintaining accuracy, such as to be large enough to capture the one target ICA peak shown in FIG. 17C.

Figure 17D:
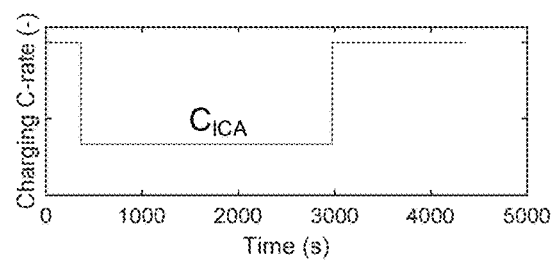
FIG. 17D is a simplified diagram showing a single charging rate of a single-stage charging cycle.
Figure 17B:
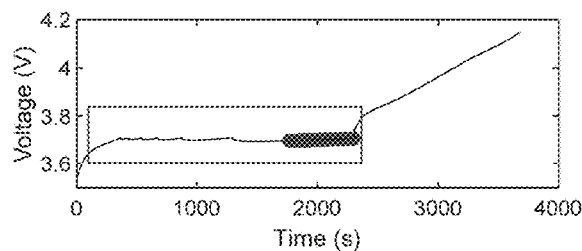
FIG. 17B is a simplified diagram showing voltage of the test battery charged at the multi-stage charging cycle illustrated in FIG. 17A, according to some embodiments.
Figure 17E:
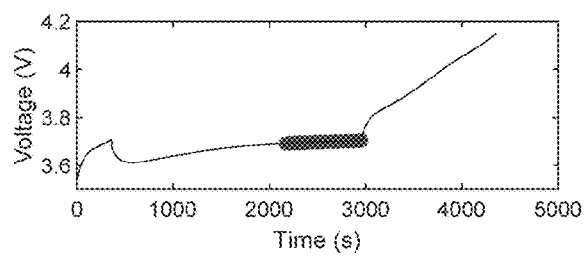
FIG. 17E is a simplified diagram showing voltage of the test battery charged at the single-stage charging cycle illustrated in FIG. 17D.
Figure 17C:
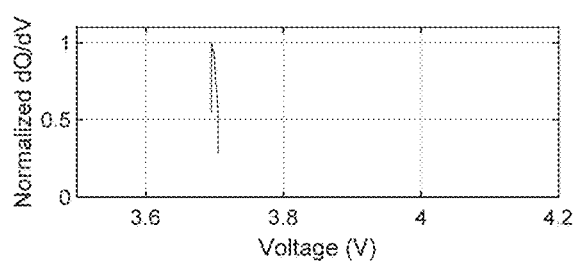
FIG. 17C is a simplified diagram showing IC data of the test battery charged at the multi-stage charging cycle illustrated in FIG. 17A, according to some embodiments.
Figure 17F:
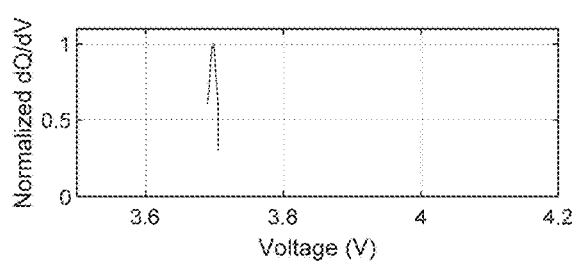
FIG. 17F is a simplified diagram showing IC data of the test battery charged at the single-stage charging cycle illustrated in FIG. 17D.

For comparison, FIG. 17D is a simplified diagram showing a single charging rate of a single-stage charging cycle. As shown, the charging current reduces straight from the normal charging rate to the ICA charging rate of $C_{ICA}$, which is maintained till about 3000 seconds into the test before changing back to the normal charging rate. This is much later than in the multi-stage charging cycle, in which the charging rate changes from the ICA charging rate back to the normal charging rate at around 2300 seconds. FIG. 17E is a simplified diagram showing voltage of the test battery charged at the single-stage charging cycle illustrated in FIG. 17D. Similarly, the interested voltage range for ICA analysis following the single-stage charging cycle ends around 3000 seconds into the test, which is much later than in the case of the battery charted at a multi-stage charging cycle, which ends around 2300 seconds. FIG. 17F is a simplified diagram showing IC data of the test battery charged at the single-stage charging cycle illustrated in FIG. 17D. As shown, the IC data, specifically, the ICA peak obtained based on QV data collected via the multi-stage charging cycle illustrated by FIG. 17A and FIG. 17B is substantially similar to the ICA peak obtained based on QV data collected via the single-stage charging cycle illustrated by FIG. 17D and FIG. 17E. Accordingly, the similar ICA peaks, when input into the SOH estimation model, would output similar SOH prediction of the test battery. The test battery charged at multi-stage charging cycle, however, took only about two-thirds of the testing time when compared to the test battery charged at single-stage charging cycle, yet providing a similar ICA peak for a similar SOH prediction.

Figure 18:
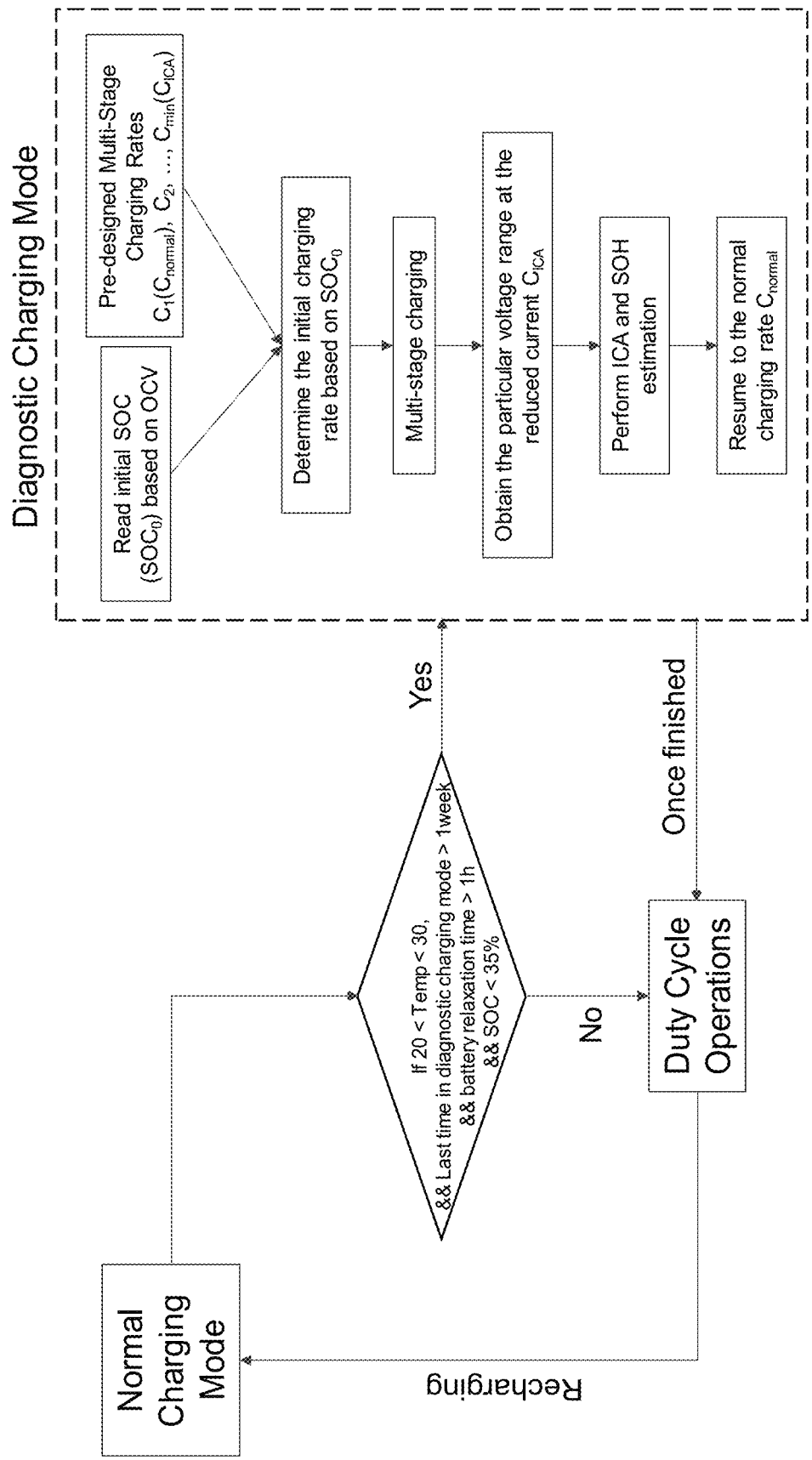
FIG. 18 is a simplified diagram showing operation of a battery in duty, according to some embodiments.

FIG. 18 is a simplified diagram showing operation of a battery in duty, according to some embodiments. As shown, a battery that is installed in and implemented in an application (e.g., electric vehicle, portable electronics, stationary storage) may be diagnosed using ICA analysis to determine its state of health. In various embodiments, the battery during normal duty cycle operations is charged and discharged normally at a normal charging and discharging rate(s). A system and/or a method for determining SOH of the battery may set one or more diagnosis conditions including one or more condition thresholds for the battery to satisfy before ICA analysis is performed. In some examples, battery temperature is a diagnosis condition, and only when the battery temperature is within a lower temperature threshold (e.g., 20° C.) and a higher temperature threshold (e.g., 30° C.), ICA analysis would begin. In some examples, time since last diagnosis is a diagnosis condition, and only when time since the last ICA analysis is longer than a time threshold (e.g., one week), ICA analysis would begin. In some examples, battery relaxation time is a diagnosis condition, and only when the battery has relaxed (e.g., neither being charged or discharged) for longer than a relaxation time threshold (e.g., one hour), ICA analysis would begin. In some examples, state of charge is a diagnosis condition, and only when the battery has a state of charge (e.g., theoretical or measured) is smaller than or equal to a SOC threshold (e.g., 35%), ICA analysis would begin.

In some embodiments, when one or more diagnosis conditions is not met, the battery will continue to be run at normal duty cycles. When In various embodiments, when the set one or more diagnosis conditions is met, the battery may automatically enter diagnostic charging mode, during a charging cycle of the battery. In certain examples, the diagnostic charging mode may be manually activated, such as by a user. For example, diagnostic charging mode may be manually activated even when one or more diagnosis conditions is not met. In some examples, when the diagnostic charging mode is manually activated, the system and/or method for determining state of health of the battery is configured to condition the battery such that the one or more diagnosis conditions is met. In various examples, the system and/or method for determining SOH of the battery is configured to follow a diagnostic schedule (e.g., once a month, $1^{st}$ day of every month) such that when the battery is scheduled for an ICA analysis, the system and/or method for determining SOH of the battery automatically conditions the battery to meet the one or more diagnosis conditions.

In various embodiments, the system and/or method for determining SOH of the battery is configured to determine, predict, or estimate the SOH of the battery, such as once the one or more diagnosis conditions is met, by charging the battery in diagnostic charging mode. In the diagnostic charging mode, the system and/or method for determining SOH reads or determines the initial SOC ($SOC_0$) of the battery, such as via open circuit voltage (OCV), and select or receive a pre-designed multi-stage charging cycle having multiple charging rates, such as based on one or more of $SOC_0$, battery SOH from last diagnostic session, battery temperature, battery age, and other battery conditions. The system and/or method for determining SOH may further determine an initial charging rate based on the pre-designed multi-stage charging cycle and/or the battery's $SOC_0$. The multi-stage charging cycle may be tailored to have different charging rate(s), interested voltage range, and/or SOC range for each charge, such as based on battery condition and/or battery electrochemistry. The system and/or method for determining SOH may further charge the battery following the pre-designed multi-stage charging cycle, obtaining QA data and IC data within a predetermined voltage range at a reduced ICA charging rate, performing ICA analysis (e.g., using ICA peak data) and SOH estimation, and after ICA analysis is complete, resuming to normal charging rate and normal duty cycle operations.

Figure 19:
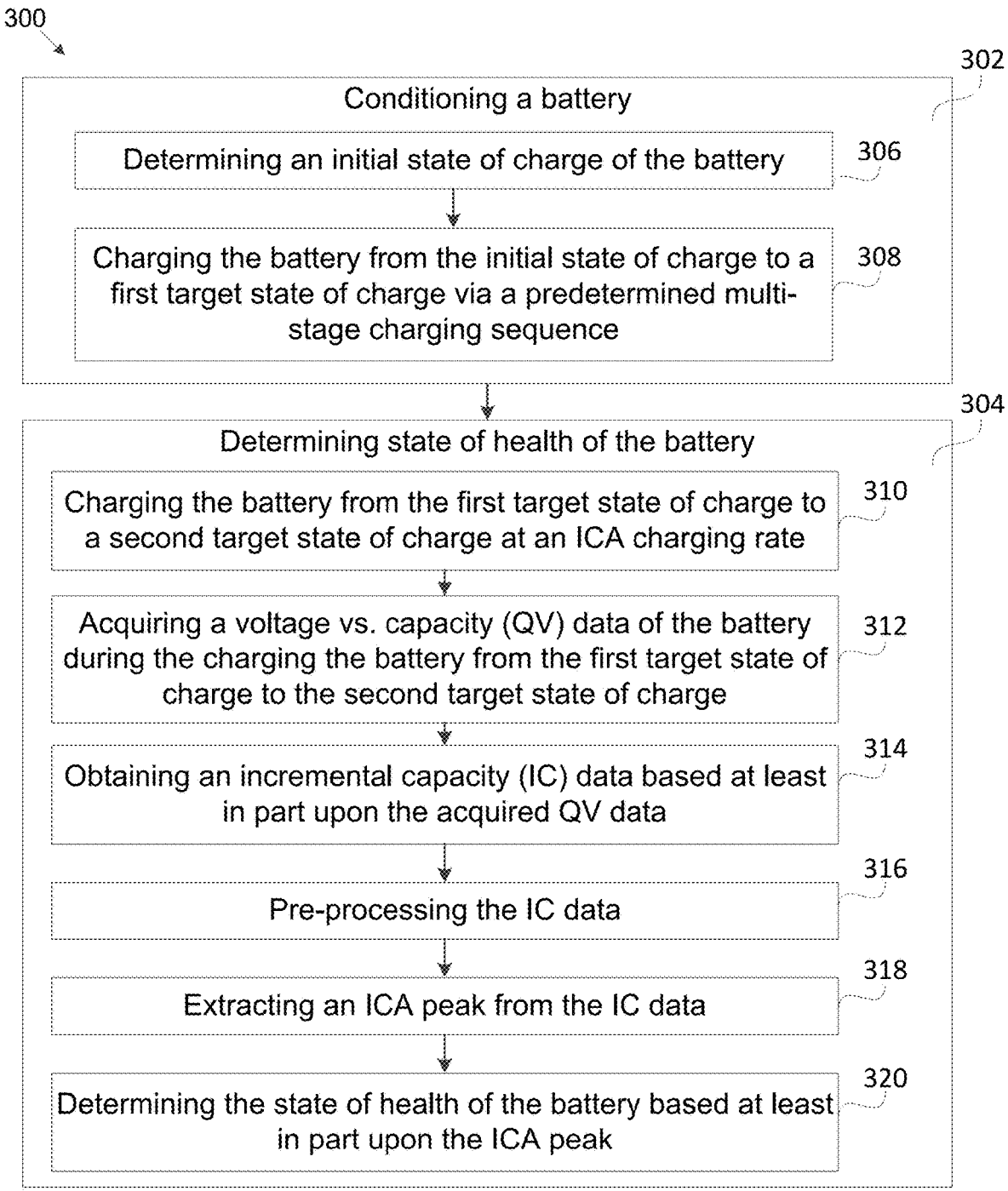
FIG. 19 is a simplified diagram showing a method for determining state of health of a battery, according to some embodiments.

FIG. 19 is a simplified diagram showing a method for determining state of health of a battery, according to some embodiments. As shown, the method 300 includes a process 302 of conditioning a battery and a process 304 of determining state of health of the battery. In some examples, conditioning the battery includes a process 306 of determining an initial state of charge of a battery and a process 308 of charging the battery from the initial state of charge to a first target state of charge via a predetermined multi-stage charging sequence. In some examples, determining the state of health of the battery includes a process 310 of charging the battery from the first target state of charge to a second target state of charge at an ICA charging rate, a process 312 of acquiring a voltage versus capacity (QV) data of the battery during charging of the battery from the first target state of charge to the second target state of charge, a process 314 of obtaining an incremental capacity (IC) data based at least in part upon the acquired QV data, a process 316 of pre-processing the IC data, a process 318 of extracting an ICA peak from the IC data, and/or a process 320 of determining the state of health of the battery based at least in part upon the ICA peak.

Figure 20:
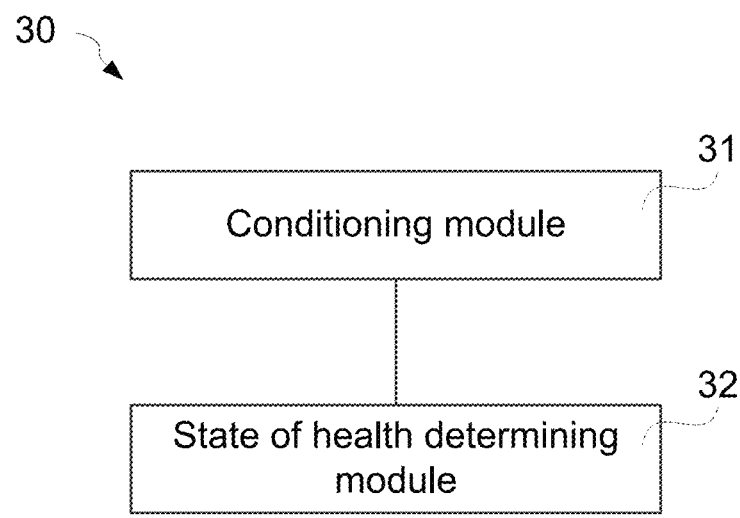
FIG. 20 is a simplified diagram showing a system for determining state of health of a battery, according to some embodiments.

FIG. 20 is a simplified diagram showing a system for determining state of health of a battery, according to some embodiments. The system 30 includes a conditioning module 31 and a state of health determining module 32. The conditioning module 31 is configured to condition the battery by at least: determining an initial state of charge of the battery; charging the battery from the initial state of charge to a first target state of charge via a predetermined multi-stage charging sequence. The state of health determining module 32 is configured to determine state of health of the battery by at least: charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an ICA peak from the IC data; and determining the state of health of the battery based at least in part upon the ICA peak.

In certain embodiments, the one or more steps of the methods of this disclosure may be performed by a computing device external to a vehicle, such as a battery management system of the vehicle. For example, the extracting of an ICA peak from IC data and/or determining of the state of health of a battery may be performed by a server, such as a server wirelessly connected to one or more vehicles (e.g., through the cloud). In some examples, a server may be connected to a plurality of vehicles (e.g., a fleet of vehicles) and configured to perform one or more steps of the methods of this disclosure, such as simultaneously. A server connected to a battery management system of the vehicle may be configured to: collect battery data and determine an initial state of charge of the battery; instruct the battery management system to charge the battery from the initial state of charge to a first target state of charge via a predetermined multi-stage charging sequence; instruct the battery management system to charge the battery from the first target state of charge to a second target state of charge at an incremental capacity analysis (ICA) charging rate; acquire a voltage vs. capacity (QV) data of the battery during charging of the battery from the first target state of charge to the second target state of charge; obtain, via one or more processors on the server, an incremental capacity (IC) data based on at least the acquired QV data; pre-process the IC data; extract an ICA peak from the IC data; and/or determine the state of health of the battery based at least in part upon the ICA peak.

Additional examples within the scope of the disclosure are listed below.

Example 38. A computer-implemented method for determining state of health of a battery, the method comprising: conditioning the battery by at least: determining an initial state of charge of the battery; charging the battery from the initial state of charge to a first target state of charge via a predetermined multi-stage charging sequence; and determining state of health of the battery by at least: charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an ICA peak from the IC data; and determining the state of health of the battery based at least in part upon the ICA peak.

Example 39. The computer-implemented method of example 38, further includes determining the multi-stage charging sequence to include a plurality of charging rates, the plurality of charging rates including a first charging rate, a second charging rate smaller than the first charging rate, and a third charging rate smaller than the second charging rate.

Example 40. The computer-implemented method of any of examples 38 to 39, wherein the charging the battery from the initial state of charge to a first target state of charge via a predetermined multi-stage charging sequence includes: charging the battery from the initial state of charge to a first intermediate state of charge at the first charging rate; charging the battery from greater than or equal to the first intermediate state of charge to a second intermediate state of charge at the second charging rate; and charging the battery from greater than or equal to the second intermediate state of charge to the first target state of charge at the third charging rate.

Example 41. The computer-implemented method of any of examples 38 to 40, wherein the first charging rate substantially equals to a normal charging rate.

Example 42. The computer-implemented method of any of examples 38 to 41, wherein the third charging rate substantially equals to the ICA charging rate.

Example 43. The computer-implemented method of any of examples 38 to 42, wherein the determining the multi-stage charging sequence includes determining the plurality of charging rates such that voltage transient of the battery has substantially decayed upon reaching the first target state of charge.

Example 44. The computer-implemented method of any of examples 38 to 43, wherein the determining the plurality of charging rates includes determining the plurality of charging rates based at least in part upon electrochemistry information associated with the battery.

Example 45. The computer-implemented method of any of examples 38 to 44, wherein the determining the plurality of charging rates includes determining the plurality of charging rates based at least in part upon state of health of the battery.

Example 46. The computer-implemented method of any of examples 38 to 45, wherein the charging the battery from the initial state of charge to a first target state of charge via a predetermined multi-stage charging sequence includes: charging the battery to a first voltage limit at the first charging rate; charging the battery to a first voltage limit at the second charging rate; and charging the battery to a first voltage limit at the third charging rate.

Example 47. The computer-implemented method of any of examples 38 to 46, further includes upon reaching the second target state of charge, charging the battery at a normal charging rate until charging of the battery is complete.

Example 48. The computer-implemented method of any of examples 38 to 47, further includes determining the first target state of charge and the second target state of charge based at least in part upon electrochemistry information associated with the battery.

Example 49. The computer-implemented method of any of examples 38 to 48, further includes pre-conditioning the battery including one of: adjusting battery temperature of the battery to within a diagnostic temperature range; relaxing the battery to meet a relaxation time threshold; and adjusting state of charge of the battery such that the initial state of charge is below a diagnostic state of charge threshold.

Example 50. The computer-implemented method of any of examples 38 to 49, the first target state of charge and the second target state of charge are less than one of 20%, 10%, 5%, and 1% apart.

Example 51. The computer-implemented method of any of examples 38 to 50, wherein the obtaining the incremental capacity (IC) data based on at least the acquired QV data includes differentiating the acquired capacity over the acquired voltage.

Example 52. The computer-implemented method of any of examples 38 to 51, wherein the determining the state of health of the battery based at least in part upon the ICA peak includes determining the state of health of the battery based at least in part upon the ICA peak using a state of health estimation model.

Example 53. The computer-implemented method of any of examples 38 to 52, further includes stopping a duty cycle operation to determine state of health of the battery.

Example 54. The computer-implemented method of any of examples 38 to 53, the battery is implemented in an electrified vehicle.

Example 55. The computer-implemented method of any of examples 38 to 54, further includes modifying a battery electrification plan associated with the battery to limit overcharging, limit aging, and improve cycle life.

Example 56. A system for determining state of health of a battery, the system comprising: a conditioning module configured to condition the battery by at least: determining an initial state of charge of the battery; charging the battery from the initial state of charge to a first target state of charge via a predetermined multi-stage charging sequence; and a state of health determining module configured to determine state of health of the battery by at least: charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an ICA peak from the IC data; and determining the state of health of the battery based at least in part upon the ICA peak.

Example 57. The system of example 56, wherein the conditioning module is further configured to determine the multi-stage charging sequence to include a plurality of charging rates, the plurality of charging rates including a first charging rate, a second charging rate smaller than the first charging rate, and a third charging rate smaller than the second charging rate.

Example 58. The system of any of examples 56 to 57, is further configured to, upon reaching the second target state of charge, charge the battery at a normal charging rate until charging of the battery is complete.

Example 59. The system of any of examples 56 to 58, wherein the conditioning module is further configured to determine the first target state of charge and the second target state of charge based at least in part upon electrochemistry information associated with the battery.

Example 60. The system of any of examples 56 to 59, wherein the conditioning module is further configured to pre-condition the battery including one of to: adjust battery temperature of the battery to within a diagnostic temperature range; relax the battery to meet a relaxation time threshold; and adjust state of charge of the battery such that the initial state of charge is below a diagnostic state of charge threshold.

Example 61. The system of any of examples 56 to 60, further includes a state of health estimation model for establishing a state of health of a battery.

Example 62. The system of any of examples 56 to 61, wherein the conditioning module is further configured to stop duty cycle operation to determine state of health of the battery.

Example 63. A non-transitory computer-readable medium with instructions stored thereon, that when executed by a processor, cause the processor to perform: conditioning the battery by at least: determining an initial state of charge of the battery; charging the battery from the initial state of charge to a first target state of charge via a predetermined multi-stage charging sequence; and determining state of health of the battery by at least: charging the battery from the first target state of charge to a second target state of charge at an ICA charging rate; acquiring a voltage vs. capacity (QV) data of the battery during charging of the battery from the first target state of charge to the second target state of charge; obtaining an incremental capacity (IC) data based on at least the acquired QV data; pre-processing the IC data; extracting an ICA peak from the IC data; and determining the state of health of the battery based at least in part upon the ICA peak.

It is to be understood that, some or all components of various embodiments of the present disclosure each are, individually and/or in combination with at least another component, implemented using one or more software components, one or more hardware components, and/or one or more combinations of software and hardware components. In another example, some or all components of various embodiments of the present disclosure each are, individually and/or in combination with at least another component, implemented in one or more circuits, such as one or more analog circuits and/or one or more digital circuits. In yet another example, while the embodiments described above refer to particular features, the scope of the present disclosure also includes embodiments having different combinations of features and embodiments that do not include all of the described features. In yet another example, various embodiments and/or examples of the present disclosure can be combined.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to perform the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, EEPROM, Flash memory, flat files, databases, programming data structures, programming variables, IF-THEN (or similar type) statement constructs, application programming interface, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, DVD, etc.) that contain instructions (e.g., software) for use in execution by a processor to perform the methods' operations and implement the systems described herein. The computer components, software modules, functions, data stores and data structures described herein may be connected directly or indirectly to each other in order to allow the flow of data needed for their operations. It is also noted that a module or processor includes a unit of code that performs a software operation and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include client devices and servers. A client device and server are generally remote from each other and typically interact through a communication network. The relationship of client device and server arises by virtue of computer programs running on the respective computers and having a client device-server relationship to each other.

This specification contains many specifics for particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be removed from the combination, and a combination may, for example, be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Although specific embodiments of the present disclosure have been described, it will be understood by those of skill in the art that there are other embodiments that are equivalent to the described embodiments. Accordingly, it is to be understood that the disclosure is not to be limited by the specific illustrated embodiments.

What is claimed is:

1. A computer-implemented method for determining state of health of a battery, the method comprising:
    conditioning the battery by charging the battery from an initial state of charge of the battery to a first target state of charge via a predetermined multi-stage charging sequence which includes:
        charging the battery from the initial state of charge to a first intermediate state of charge at a first charging rate;
        charging the battery from greater than or equal to the first intermediate state of charge to a second intermediate state of charge at a second charging rate smaller than the first charging rate; and
        charging the battery from greater than or equal to the second intermediate state of charge to the first target state of charge at the third charging rate smaller than the second charging rate; and
    charging the battery from the first target state of charge to a second target state of charge at an incremental capacity analysis (ICA) charging rate;
    acquiring a voltage vs. capacity (QV) data of the battery during charging of the battery from the first target state of charge to the second target state of charge;
    obtaining an incremental capacity (IC) data based on at least the acquired QV data;
    pre-processing the IC data;
    extracting an ICA peak from the IC data; and
    determining the state of health of the battery based at least in part upon the ICA peak.

2. The computer-implemented method of claim 1, wherein the first charging rate substantially equals to a normal charging rate.

3. The computer-implemented method of claim 1, wherein the third charging rate substantially equals to the ICA charging rate.

4. The computer-implemented method of claim 1, wherein the determining the multi-stage charging sequence includes determining the plurality of charging rates such that voltage transient of the battery has substantially decayed upon reaching the first target state of charge.

5. The computer-implemented method of claim 1, wherein the determining the plurality of charging rates includes determining the plurality of charging rates based at least in part upon electrochemistry information associated with the battery.

6. The computer-implemented method of claim 1, wherein the determining the plurality of charging rates includes determining the plurality of charging rates based at least in part upon state of health of the battery.

7. The computer-implemented method of claim 1, further comprising:
determining the first target state of charge and the second target state of charge based at least in part upon electrochemistry information associated with the battery.

8. The computer-implemented method of claim 1, wherein the first target state of charge and the second target state of charge are less than one of 20%, 10%, 5%, and 1% apart.

9. The computer-implemented method of claim 1, wherein the obtaining the incremental capacity (IC) data based on at least the acquired QV data includes differentiating the acquired capacity over the acquired voltage.

10. The computer-implemented method of claim 1, wherein the determining the state of health of the battery based at least in part upon the ICA peak includes using a state of health estimation model.

11. The computer-implemented method of claim 1, further comprising stopping a duty cycle operation to determine state of health of the battery.

12. The computer-implemented method of claim 1, wherein the battery is implemented in an electrified vehicle.

13. The computer-implemented method of claim 12, further comprising modifying a battery electrification plan associated with the battery to limit overcharging, limit aging, and improve cycle life.

14. A battery management system for determining state of health of a battery, the system comprising:
a processor; and
a memory including instructions that, upon execution by the processor, causes the processor to perform the method of claim 1.

15. A vehicle comprising:
an electric motor for propelling the vehicle;
a battery for powering the electric motor, the battery configured to be coupled to an external power source; and
a battery management system for controlling the battery, the battery management system including:
a processor, and
a memory including instructions that, upon execution by the processor, causes the processor to perform the method of claim 1.

16. A computer-implemented method for determining state of health of a battery, the method comprising:
conditioning the battery by charging the battery from an initial state of charge of the battery to a first target state of charge via a predetermined multi-stage charging sequence which includes:
charging the battery to a voltage limit at a first charging rate;
charging the battery to the voltage limit at a second charging rate smaller than the first charging rate; and
charging the battery to the voltage limit at a third charging rate smaller than the second charging rate;
charging the battery from the first target state of charge to a second target state of charge at an incremental capacity analysis (ICA) charging rate;
acquiring a voltage vs. capacity (QV) data of the battery during charging of the battery from the first target state of charge to the second target state of charge;
obtaining an incremental capacity (IC) data based on at least the acquired QV data;
pre-processing the IC data;
extracting an ICA peak from the IC data; and
determining the state of health of the battery based at least in part upon the ICA peak.

17. A computer-implemented method for determining state of health of a battery, the method comprising:
conditioning the battery by charging a battery from an initial state of charge of the battery to a first target state of charge via a predetermined multi-stage charging sequence;
charging the battery from the first target state of charge to a second target state of charge at an incremental capacity analysis (ICA) charging rate;
upon reaching the second target state of charge, charging the battery at a normal charging rate until charging of the battery is complete;
acquiring a voltage vs. capacity (QV) data of the battery during charging of the battery from the first target state of charge to the second target state of charge;
obtaining an incremental capacity (IC) data based on at least the acquired QV data;
pre-processing the IC data;
extracting an ICA peak from the IC data; and
determining the state of health of the battery based at least in part upon the ICA peak.

18. A computer-implemented method for determining state of health of a battery, the method comprising:
adjusting battery temperature of the battery to within a diagnostic temperature range;
relaxing the battery to meet a relaxation time threshold;
pre-conditioning the battery by adjusting state of charge of the battery such that an initial state of charge of the battery is below a diagnostic state of charge threshold;
conditioning the battery by charging the battery from the initial state of charge to a first target state of charge via a predetermined multi-stage charging sequence;
charging the battery from the first target state of charge to a second target state of charge at an incremental capacity analysis (ICA) charging rate;
acquiring a voltage vs. capacity (QV) data of the battery during charging of the battery from the first target state of charge to the second target state of charge;
obtaining an incremental capacity (IC) data based on at least the acquired QV data;
pre-processing the IC data;
extracting an ICA peak from the IC data; and
determining the state of health of the battery based at least in part upon the ICA peak.

* * * * *